(12) United States Patent
Tran et al.

(10) Patent No.: US 6,410,948 B1
(45) Date of Patent: Jun. 25, 2002

(54) MEMORY CELL ARRAYS COMPRISING INTERSECTING SLANTED PORTIONS

(75) Inventors: Luan Tran, Meridian; D. Mark Duncan, Boise; Tyler A. Lowrey, Boise; Rob B. Kerr, Boise; Kris K. Brown, Garden City, all of ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/340,983

(22) Filed: Jun. 28, 1999

Related U.S. Application Data

(63) Continuation-in-part of application No. 08/918,657, filed on Aug. 22, 1997.

(51) Int. Cl.[7] .................. H01L 27/10; H01L 29/76; H01L 29/94; H01L 31/112; H01L 29/80

(52) U.S. Cl. .................. 257/202; 251/201; 251/203; 251/259; 251/260; 251/390; 251/391

(58) Field of Search ............... 257/202, 203, 257/204, 259, 260, 390, 391, 755, 756; 365/149

(56) References Cited

U.S. PATENT DOCUMENTS 5,107,459 A    4/1992   Chu et al.
5,194,752 A *  3/1993   Kumagai et al. ........... 257/390
5,340,765 A    8/1994   Dennison et al.
5,605,857 A    2/1997   Jost et al.
5,747,844 A *  5/1998   Aoki et al. ................. 257/296
6,026,010 A *  2/2000   Ema et al. .................. 365/149

OTHER PUBLICATIONS

Masami Aoki, et al., *Fully Self–Aligned $6F^2$ Cell Technology for Low Cost IGb DRAM*, 1996 Symposium on VLSI Technology Digest of Technical Papers, 22–23 (1996).

* cited by examiner

*Primary Examiner*—Eddie Lee
*Assistant Examiner*—Jesse A. Fenty
(74) *Attorney, Agent, or Firm*—Trop, Pruner & Hu,P.C.

(57) ABSTRACT

A memory device includes memory cells, bit lines, active area lines running generally in parallel to the bit lines, and transistors formed in each active area line and electrically coupling memory cells to corresponding bit lines. Each bit line includes slanted portions that intersect a corresponding portion of an active area line at an angle. Contacts electrically coupling the bit line to portions of the active area line are formed in a region generally defined by the angled intersection of the bit line to the active area line. The memory cells can have an area of about $6F^2$, and the bit lines can be coupled to sense amplifiers in a folded bit line configuration. Each bit line includes a first level portion and a second level portion.

36 Claims, 19 Drawing Sheets

MEMORY CELL ARRAYS COMPRISING INTERSECTING SLANTED PORTIONS

CROSS REFERENCE TO RELATED APPLICATIONS

This application is a continuation-in-part of U.S. patent application Ser. No. 08/918,657, filed Aug. 22, 1997, entitled "PROCESSING METHODS OF FORMING INTEGRATED CIRCUITRY MEMORY DEVICES, METHODS OF FORMING DRAM ARRAYS, AND RELATED SEMICONDUCTOR MASKS."

BACKGROUND

The invention relates to memory cell arrays.

In a continuing effort to reduce the size of memory devices, different memory cell array topologies have been proposed. FIG. 24 illustrates a portion of a typical memory cell array in a semiconductor memory device (such as a dynamic random access memory) that includes parallel word lines 100 running along one direction and bit lines 102 running generally perpendicularly to the word lines 100. Bit line contacts 104 electrically connect the bit lines 102 and the associated cell structure, generally indicated as 106.

The size of each cell is typically described in terms of its feature size (F). The feature size is based on the width of the electrically conductive lines (i.e., the word lines and bit lines), referred to as L, and the width of the isolation space between the conductive lines, referred to as S. The sum of L and S is the minimum pitch of the memory device. The feature size (F) is half the minimum pitch, or half the sum of L and S, that is, $$F = \frac{L+S}{2}. \qquad \text{(Eq. 1)}$$

In the cell configuration shown in FIG. 24, the width of each cell along the word line direction is 2F while the width along the bit line direction is 4F. This results in a cell size of $8F^2$ (2F×4F). To reduce the size of memory devices, reduced memory cell topologies have been proposed, including $6F^2$ cells. However, with reduced cell sizes, several issues need to be addressed, including capacitor size, ease of contact to cells, and alignment between the contacts and cells.

In addition, processing of semiconductor devices typically involves many steps in which layers of material are formed over a substrate and subsequently patterned into a desired feature or structure. Typical features or structures include conductive lines (e.g., word lines, bit lines) and contact openings. Each time a patterning or etching step is conducted, certain risks arise which can jeopardize the integrity of a wafer being processed. For example, a mask misalignment error can cause a subsequent etch to undesirably etch into wafer or substrate structure which can cause catastrophic failure. Accordingly, a need exists to reduce the number of processing steps utilized in the formation of integrated circuitry.

SUMMARY

In general, in one embodiment, a memory device includes bit lines and continuous active area lines extending generally in a first direction and intersecting at slanted portions.

Other features and advantages will become apparent from the drawings and from the following claims.

DETAILED DESCRIPTION

In the following description, numerous details are set forth to provide an understanding of the present invention. However, it is to be understood by those skilled in the art that the present invention may be practiced without these details and that numerous variations or modifications from the described embodiments may be possible.

Figure 1A:
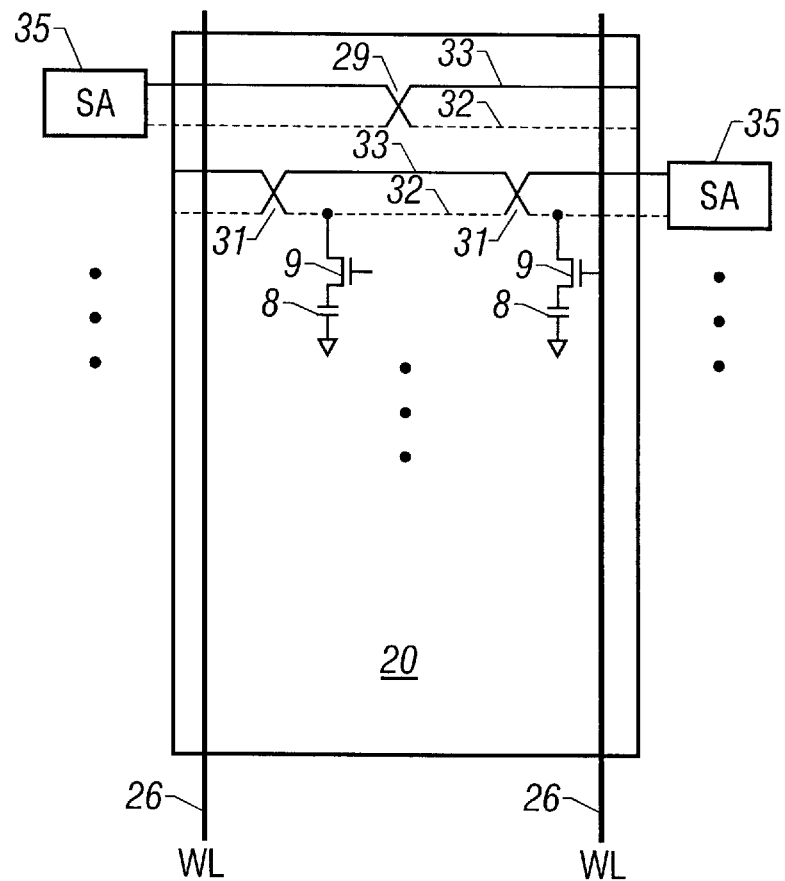
FIGS. 1A and 1B are schematic diagrams of memory arrays.

FIG. 1A is a schematic diagram of an exemplary memory array 20 in a memory device that includes word lines 26 running generally in parallel along one direction and bit line pairs 32 running generally in parallel along a perpendicular direction. A memory cell is represented schematically as a capacitor 8, and is connected by a transistor 9 to one of the bit lines BL or BL__. Each transistor 9 is activated by a word line 26.

A row of memory cells 8 is selected upon activation of a word line 26. The state of each memory cell in the row is transferred to a bit line 32 for sensing by the sense amplifiers 35, each connected to a pair of bit lines 32. In the illustrated embodiment, the bit lines 32 are vertically twisted at one or more predetermined locations in the array 20 to reduce soft error rates.

Figure 2A:
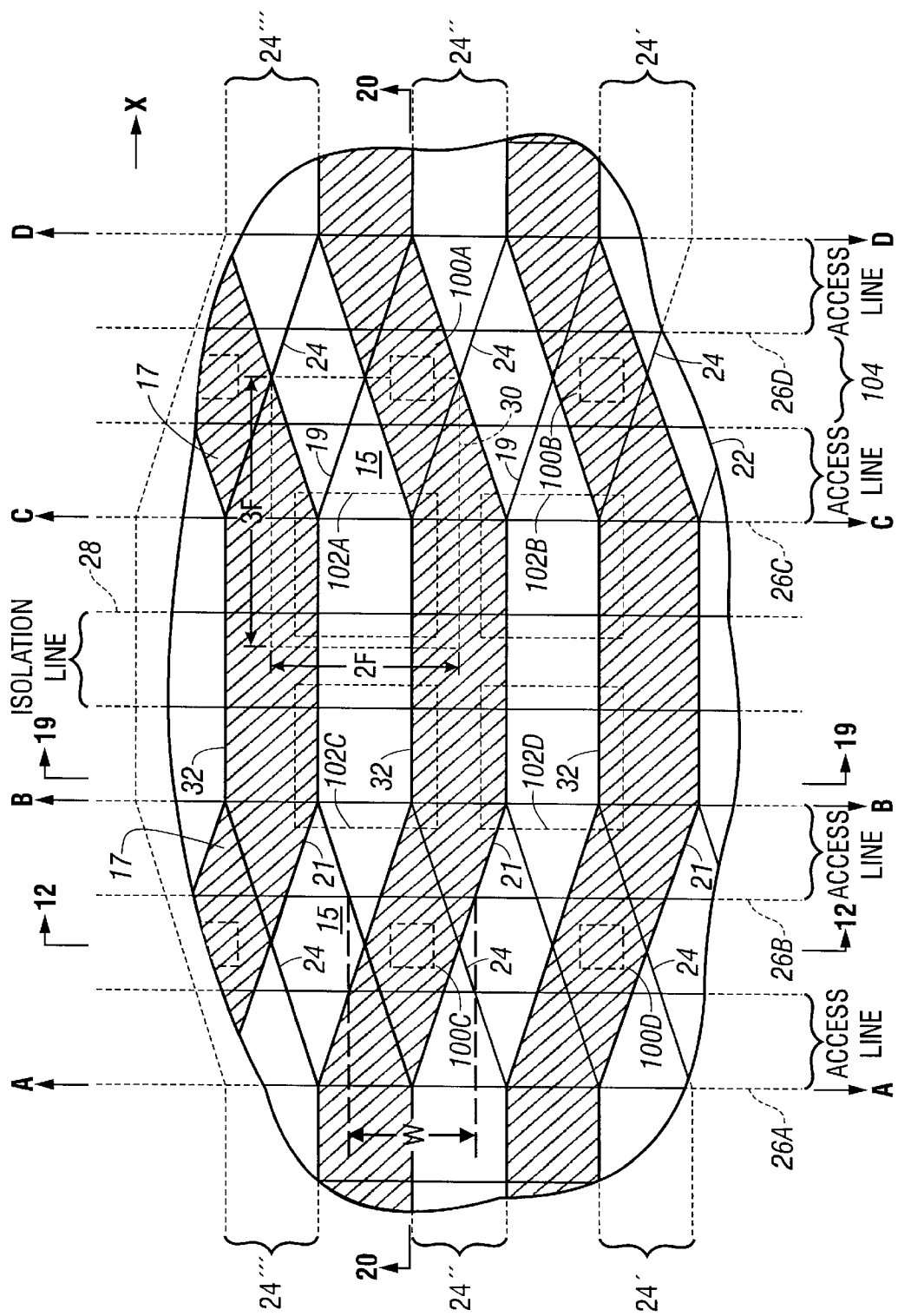
FIGS. 2A and 2B are enlarged, top views of a semiconductor wafer fragment in accordance with embodiments of the invention.

FIG. 2A shows the layout of a portion of the memory array of a semiconductor memory device according to one embodiment (which may be a dynamic random access memory or DRAM, for example). Other types of memory devices include synchronous DRAMs, video RAMs, or other modified versions of the DRAM. The memory array 20 includes a semiconductive substrate 22. As used in this document, the term "semiconductive substrate" is defined to mean any construction comprising semiconductive material, including bulk semiconductive materials such as a semiconductive wafer (either alone or in assemblies comprising other materials thereon), and semiconductive material layers (either alone or in assemblies comprising other materials). The term "substrate" refers to any supporting structure, including the "semiconductive substrates" described above.

The memory cell transfer transistors 9 are formed in the substrate 22 in a plurality of continuous active areas 24 running generally in parallel to each other. Each active area 24 is defined between isolation regions 34 (see FIG. 3) disposed relative to the substrate 22. To form a transistor in an active area, impurity doped regions (not shown) are formed in the substrate (along the length of each active area 24) to create the source and drain of the transistor. A word line 26 forms the gate of the transistor.

The transistor formed in the active area provides the pass gate that is controllable to electrically connect a cell capacitor (indicated as 102A, B, C, or D in FIG. 2A) to a bit line 32. Each of the capacitors 102 are electrically connected by contact plugs to an active area line 24 portion forming a node (source or drain) of a transistor 9. Each bit line 32 is connected to the active area line portion forming the other node of the transistor 9 by bit contact 100A or 100B. For example, activation of a word line 26C will cause the stored charges from the capacitors 102A and 102B to be transferred by corresponding transistors 9 to bit lines 32. Although depicted as squares in FIG. 2A, the contacts 100 can be of different shapes, and can take up the entire area of intersection between the bit lines 32 and the active area lines 24.

For clarity, each illustrated continuous active area line 24 has been shown to extend to outside of the boundary of substrate 22 utilizing dashed lines. Each individual active area is designated separately as 24', 24", and 24"'. To reduce the effective memory cell area while still maintaining ease of manufacture as discussed below, the continuous active areas 24', 24", and 24"' are not straight or linear, but rather weave relative to the substrate within which they are formed such that bends are created in each active area line 24 as it extends across the array. Effectively, the active area lines appear wavy across the array. The illustrated individual continuous active area lines extend generally horizontally across the page upon which FIG. 2A appears, but jog upwardly repeatedly as depicted in FIG. 2A to form protruding portions 19. This jogging is repeated along the length of the active area line 24.

Similarly, the bit lines 32 (which are formed above the active area lines 24) also weave relative to the substrate such that repeated depressed portions 21 are formed in the bit lines. The bit lines 32 run generally along the same direction as the active areas 24, but the direction of the jog in the bit lines 32 is opposite to the jog of the active area lines 24. Thus, in the FIG. 2A embodiment, both bit lines and active area lines are formed to be wavy as they extend generally across the memory array. The bit lines and active area lines intersect at slanted portions 17 and 15, respectively, where the bit lines and active area lines are bent. In the FIG. 2A embodiment as well as in some other embodiments such as those described below, corresponding edges of the bit lines and active area lines are laterally spaced apart by some distance, that is, the bit lines and active area lines do not extend completely one on top of another except where they intersect at slanted portions.

Bit contacts 100 are formed at the intersections of the bit lines 32 and the active area lines 24. Since the bit lines 32 and active area lines 24 are slanted with respect to each other in the region of each intersection, formation of the contact hole in which the bit contact 100 is formed is made easier. This is because of the increase in width W of the contact hole (such as the contact hole 40 in FIG. 5) as compared to the width if both the active area lines 24 and bit lines 32 are generally straight. As the feature size of memory devices continue to decrease (e.g., 0.18 or 0.25 microns), such increases in the width of the bit contact holes result in generally more reliable bit contacts.

More specifically, as depicted in FIG. 2A, each of the bit lines 32 and active area lines 24 run generally along the X direction. The jogs in the bit lines and active area lines are formed at predetermined positions A—A, B—B, C—C, and D—D. At position A—A, each active area line 24 bends or jogs in a first direction (e.g., upwards) while each bit line 32 bends or jogs in a second, opposite direction (e.g., downwards). The angle of the bends can be set at, for example, about 22.5°, although other angles are also possible. In addition, the directions of the active area and bit lines bends or jogs can be switched.

As further shown in FIG. 2A, at position B—B, each of the active area and bit lines bends or jogs back in the opposite directions of the corresponding bends or jogs at position A—A such that both the active area and bit lines run again generally along the X direction. At position C—C the active area and bit lines bend or jog again, also in the opposite directions from the corresponding bends or jogs at position A—A. At position D—D, the lines bend or jog back to run generally in the X direction.

One advantage of weaving both the active area and bit lines in the array is that a smaller bend angle is required for the repeated jogs while still achieving the desired memory cell area reduction.

Further, if desired, the amount of bending of the active area and bit lines can be selected to be different. Thus, for example, the angle of the bends in each active area line can be selected to be larger than the angle of the bends in each bit line. This may be desirable since it is easier to form the deeper jogs in the active area lines since they are formed in a relatively flat surface of the substrate as compared to the bit lines, which are formed over a number of structures, including word lines.

A plurality of conductive lines 26, 28 are also formed (under the bit lines 32) that run generally perpendicularly to the active area 24 and bit lines 32. In the illustrated example, four of the conductive lines are designated with numeral 26 and one of the conductive lines is designated with numeral 28. A pair of conductive lines 26 may be seen on either side of conductive line 28. The conductive lines 26 form the access or word lines (or access gates) in the DRAM array, while the conductive lines 28 are grounded to provide isolation lines (or isolation gates) between word lines 26. Conductive lines 26, 28 run generally vertically as viewed in FIG. 2A. The active area lines 24 and conductive lines 26, 28 constitute or define an array over which a plurality of memory cells are formed.

In the array 20, the word or access lines 26 are relatively straight (formed generally as parallelograms in given portions of the array). The word or access lines 26 intersect slanted portions of the active area lines 24 and bit lines 32.

The area which is consumed by a single memory cell in accordance with this embodiment is illustrated by dashed outline 30. Such area can be considered or described as relative to the feature size F, as discussed above. As shown, a single memory cell is about 3F wide by about 2F deep, thus providing a consumed area for a single memory cell of about $6F^2$. In one implementation, F is no greater than 0.25 micrometer, and preferably, no greater than 0.18 micrometer. However, other dimensions (either larger or smaller) are also contemplated.

In one implementation, adjacent word lines 26 share an intervening bit contact 100 of adjacent pairs of memory cells as will become apparent below. For example, as shown in FIG. 2A, word lines 26C and 26D share bit contacts 100A and 100B, while word lines 26A and 26B share bit contacts 100C and 100D. Electrical isolation between the adjacent pairs of memory cells is provided by intervening isolation line 28. Line 28, in operation, is connected with a ground or suitable negative voltage. Alternatively, the electrical isolation can be provided by field oxide.

Figure 12:
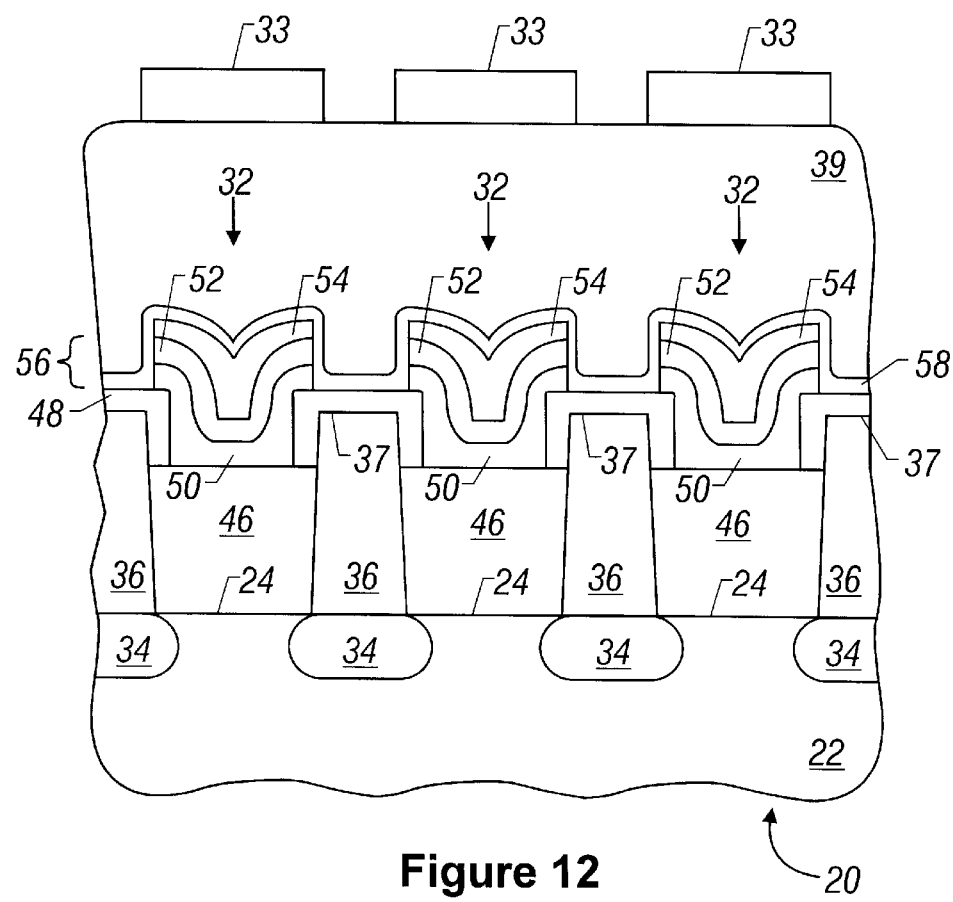
FIG. 12 corresponds to FIG. 3 but shows the wafer fragment at another processing step.

Bit contacts 100, which can be formed of an electrically conductive plug 46 (as shown in FIG. 12) and can be made of a conductively doped polysilicon, electrically connect the bit lines 32 to the underlying active areas 24. The bit contacts 100 are located in the space 104 between two adjacent word lines 26. The memory cell capacitors 102 are electrically contacted to the active areas 24.

Figure 2B:
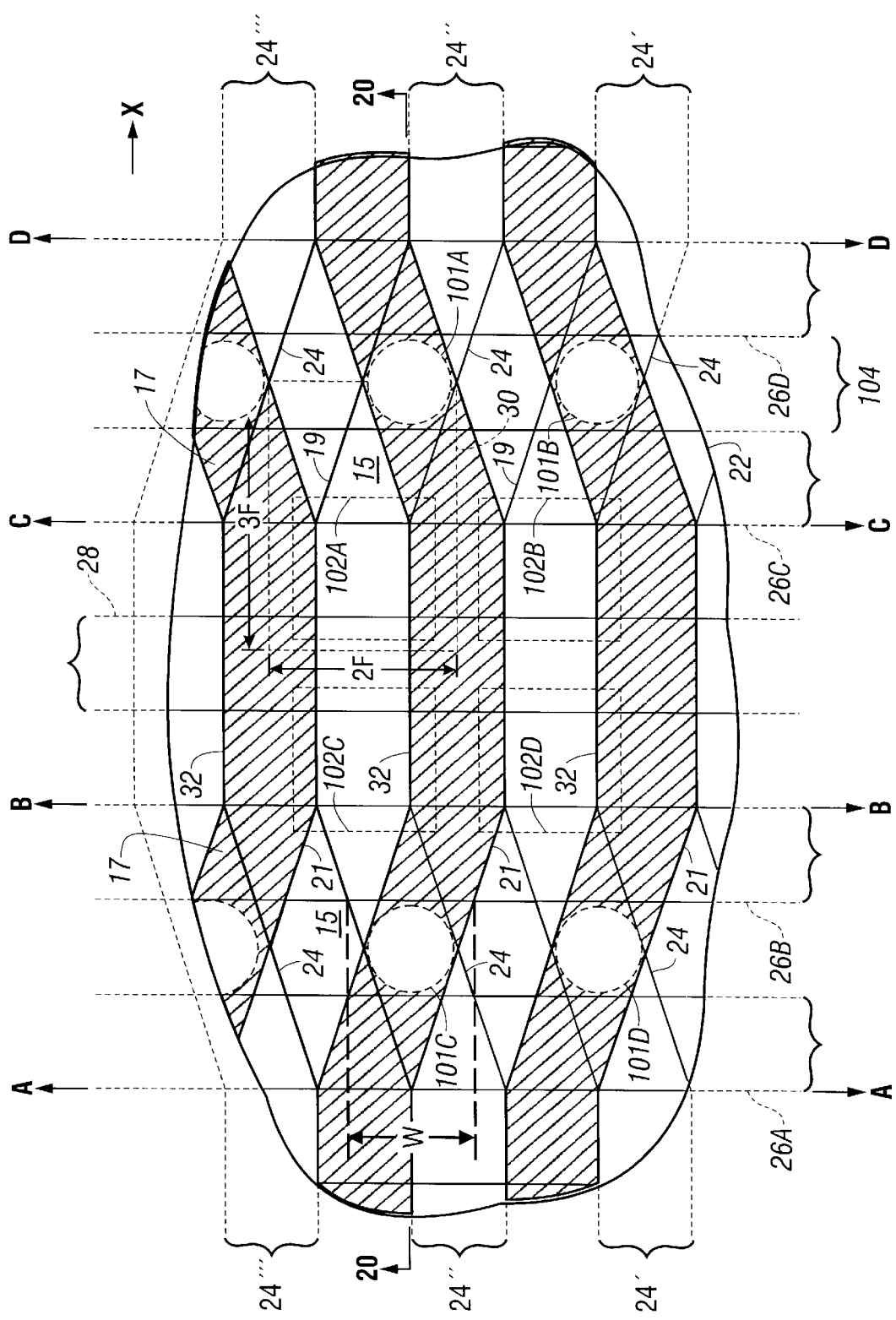

The FIG. 2B embodiment is the same as the FIG. 2A embodiment except that bit contacts 101 (101A, 101B, 101C, and 101D illustrated) in the FIG. 2B embodiment are formed with a different process than bit contacts 100 (100A, 100B, 100C, and 100D) in the FIG. 2A embodiment. Similarly, formation of contacts from electrodes of capacitors 102 to corresponding active areas 24 is also different. This is described further below.

Figure 19A:
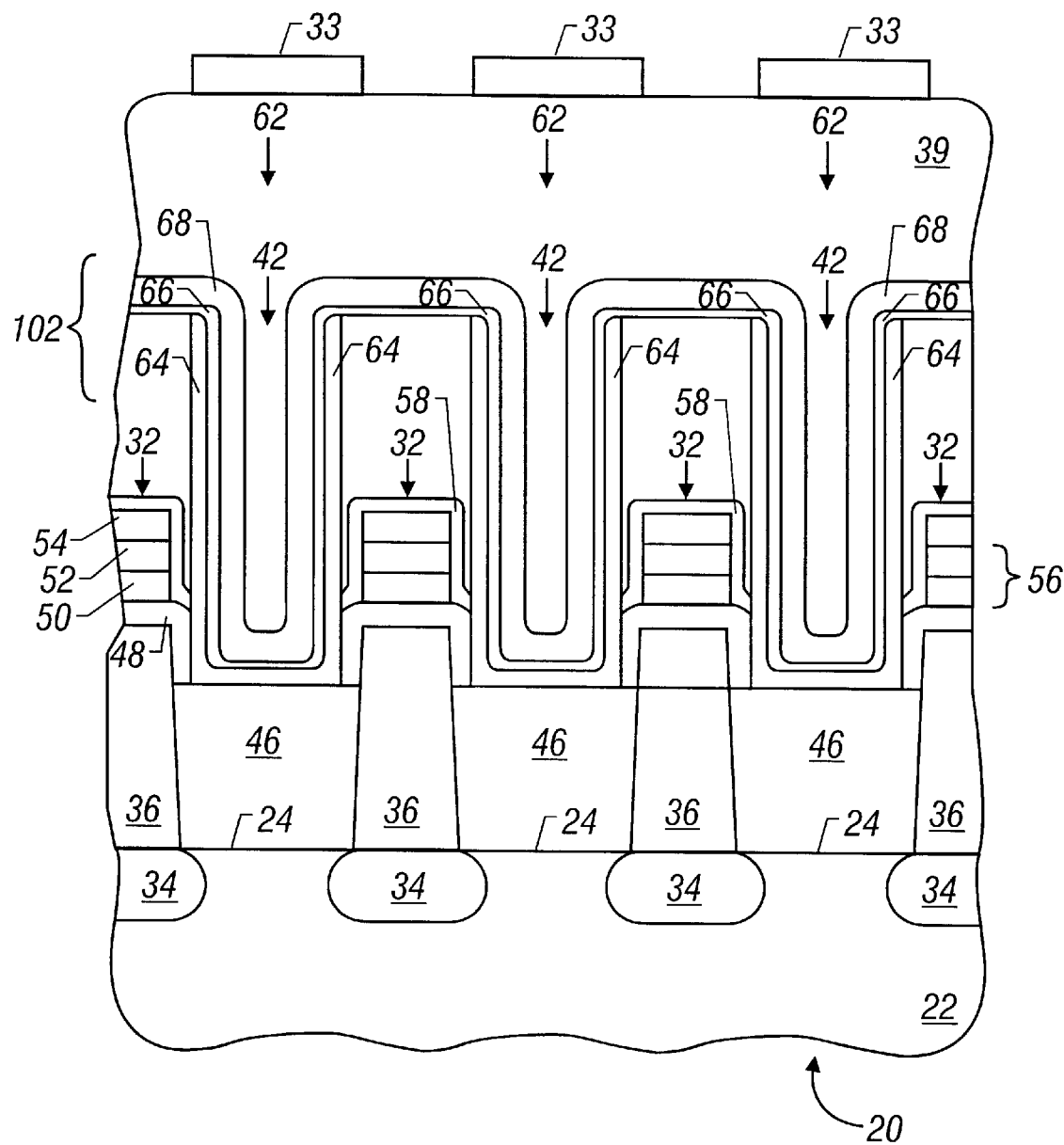
FIGS. 19A and 19B correspond to FIG. 3 but show the wafer fragment at another processing step according to embodiments.

According to one embodiment, cross-sectional views of the memory array 20 of FIG. 2A are shown in FIGS. 12 and 19A, which are cross-sections taken along lines 12—12 and 19—19, respectively. In FIG. 12, active areas 24 are defined relative to the substrate 22, with the bit contacts 100, which include electrically conductive plugs 46, disposed above and in electrical contact with portions of the active areas 24. Further, the bit lines 32, which can be formed of electrically conductive multilayer structures 56, are disposed above and in electrical contact with the bit line contact plugs 46.

Figure 19B:
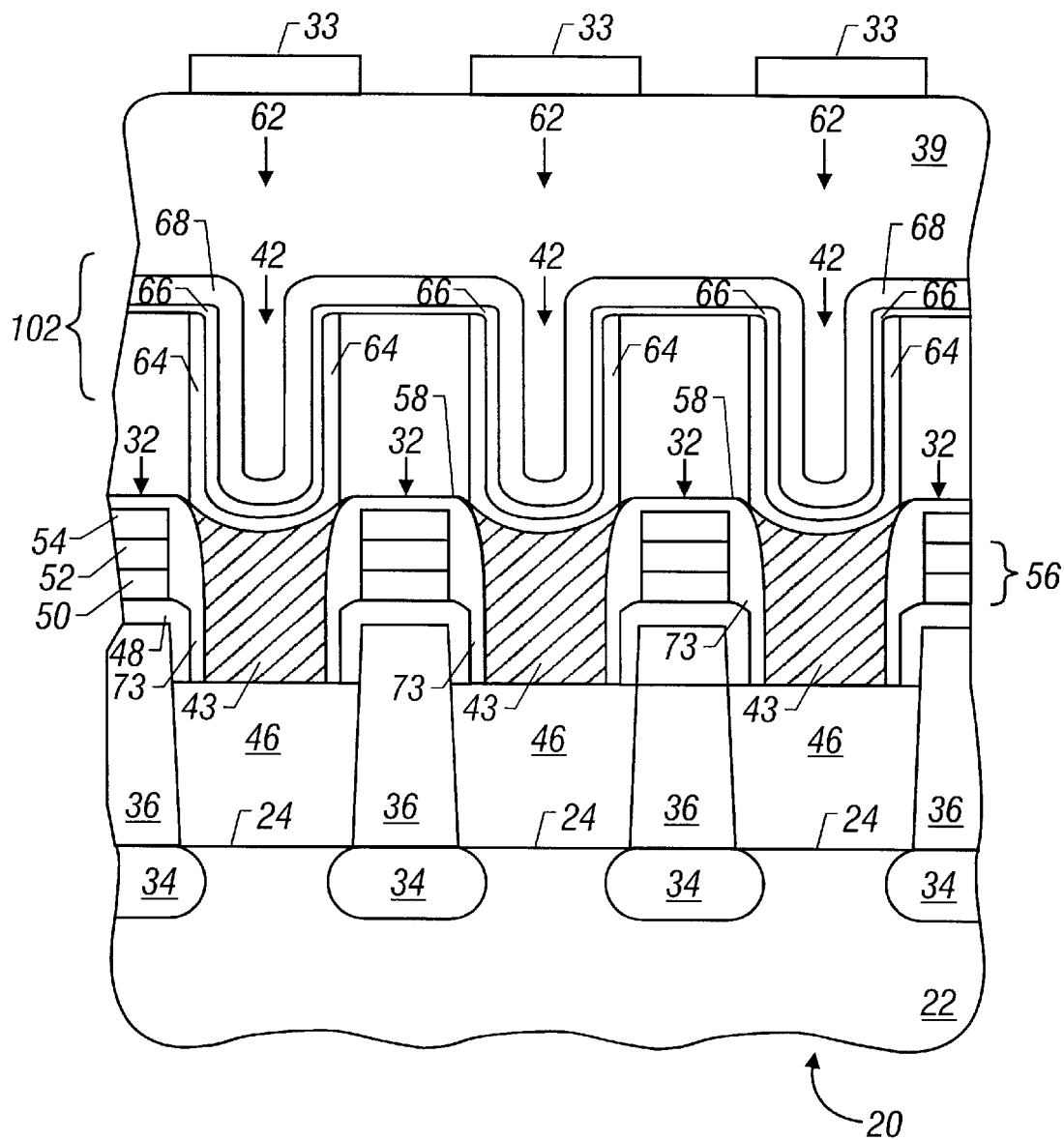

In FIG. 19A, the cell capacitors 102 are illustrated. FIG. 19B illustrates an alternative embodiment, as described below. Each capacitor 102 is formed of a first capacitor plate 64, a dielectric layer 66, and a second capacitor plate 68. The first capacitor plate 64 of each cell is electrically contacted to the plug 46 for electrical connection to the active area 24. The cell capacitor structure is laid over the bit line structure 56, which forms a cell-over-bit line (COB) array structure. An advantage the COB structure offers is that bit line contact openings need not be made in the second capacitor plate 68, which eliminates difficulties associated with aligning bit line contact openings in the second plate 68 to cell structures or word lines in the array. The bit line structure 56 is referred to as a buried bit line and corresponds to the bit line 32 in FIG. 2A.

Although FIGS. 12 and 19A illustrate details of cross-sections of the memory array according to one embodiment, it is to be understood that the invention is not to be limited in this respect. Other types of memory structures are contemplated and within the scope of the present invention.

In the illustrated embodiment, a "double deck" bit line architecture is used, which includes the buried bit line 56 and a top deck bit line 33 (FIGS. 12 and 19A) formed above the buried bit lines 32 and the capacitors 102. As shown in FIGS. 12 and 19A, an insulating layer 39 is formed between the top deck bit line 33 and the underlying structure. The top deck bit line 33 is generally formed of a metal, such as aluminum. In FIG. 1A, the top deck bit line 33 is represented schematically as solid lines, while the buried bit lines 32 are represented as dashed lines. The top deck bit lines 33 do not make contact with the memory array. Contact to the memory array transistors are made by the buried bit lines. At the locations where twists are indicated (such as vertical twists 29 and 31 in FIG. 1A), the top deck bit line 33 is connected to a buried bit line 32. Because the top deck bit lines 33 do not need to make contact to the underlying cell structure, they can be relatively straight, as shown in FIGS. 12 and 19A. In addition, contact openings are not needed through the second capacitor plate 68 (FIG. 19A) of the memory array. This avoids problems associated with aligning the contact openings in the second capacitor plate 68 to the underlying word line and bit line structures.

Figure 1B:
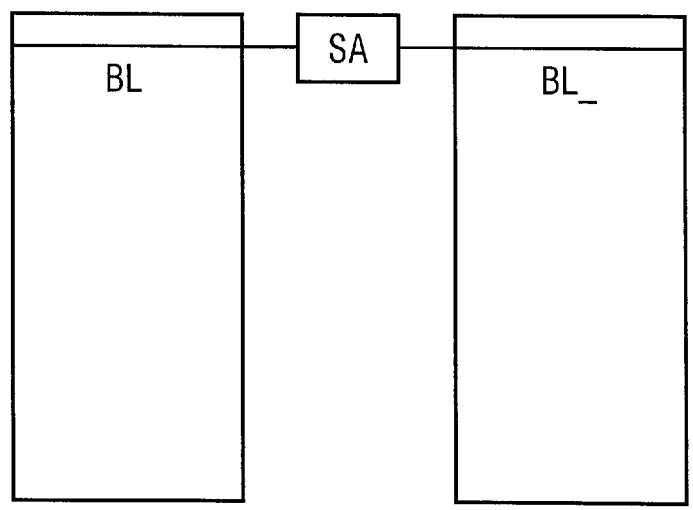

By using the double deck bit line structure, the bit lines 32, 33 can be connected to the sense amplifiers 35 in a vertically folded bit line configuration, as depicted in FIG. 1A. Thus, with the double deck bit lines in a vertically folded bit line arrangement, the column pitch occupies a 2F width, as opposed to a 4F pitch for traditional memory cells. This allows formation of a $6F^2$ memory cell. One advantage of the folded bit line configuration is that it is less susceptible to soft errors than the open bit line configuration. Because a bit line pair is connected to each sense amplifier 35 on the same side of the sense amplifier, noise created by alpha particles will couple to both of the bit lines in the pair. As the sense amplifier 35 detects the difference in voltage between the pair of bit lines, errors due to such noise effects are reduced. In an alternative embodiment, the $6F^2$ memory cell may be used with an open bit line arrangement, in which BL and BL_ are on opposite sides of a sense amplifier, as illustrated in FIG. 1B.

Figure 21:
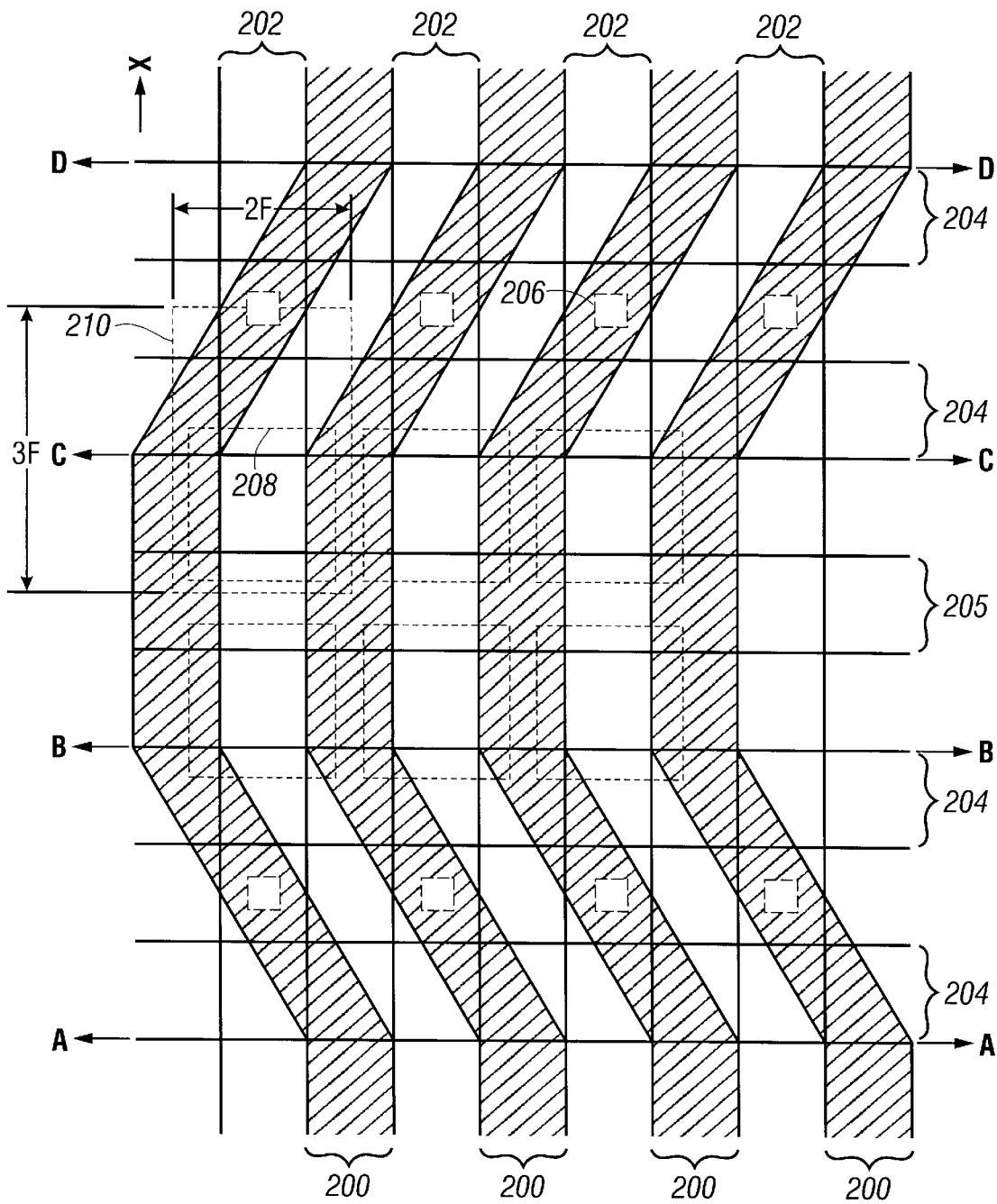
FIG. 21 is an enlarged top view of a semiconductor wafer fragment in accordance with another embodiment of the invention.

Referring to FIG. 21, an alternative embodiment of an array containing reduced size memory cells (e.g., $6F^2$ cells) is shown. In this configuration, bit lines 200 are formed to weave relative to the substrate 20, while continuous active area lines 202 are generally straight. Bit contacts 206 are formed at the intersections between the bit lines 200 and active area lines 202. In addition, memory cell capacitors 208 are formed over and are in electrical contact with portions of the active area lines 202. Although illustrated as generally straight it is to be understood that the straightness of the active area line or other structures (including bit lines) in this application depends on manufacturing tolerances. In addition, slight protrusions may be needed for forming contacts or other structures.

As illustrated, each bit line 200 runs generally in the X direction and jogs or protrudes upwardly in a repeated pattern. Each bit line 200 bends upwardly at position A—A (at an angle of about 45° with respect to the X axis). The bit line 200 then bends in the opposite direction at position B—B so that it runs generally in the X direction. After a short run, the bit line 200 then bends downwardly at position C—C. At position D—D, the bit line 200 again bends back to run generally in the X direction. This pattern is repeated throughout the memory array to provide a wavy bit line.

As indicated by the dashed outline 210, the feature size of the memory cell in this configuration is also about $6F^2$ (3F by 2F). Conductive lines 204, 205 run generally perpendicularly to the active areas 202. The conductive lines 204 form the word lines in the array while the lines 205 are grounded or driven to a negative voltage to provide electrical isolation between word lines 204.

In comparing the memory cell layouts shown in FIGS. 2A and 21, one advantage offered by the cell layout of FIG. 2A is that photolithography exposure to form the bit lines and active areas is easier to achieve due to the smaller bends of the bit lines and active areas in the FIG. 2A embodiment.

Figure 22:
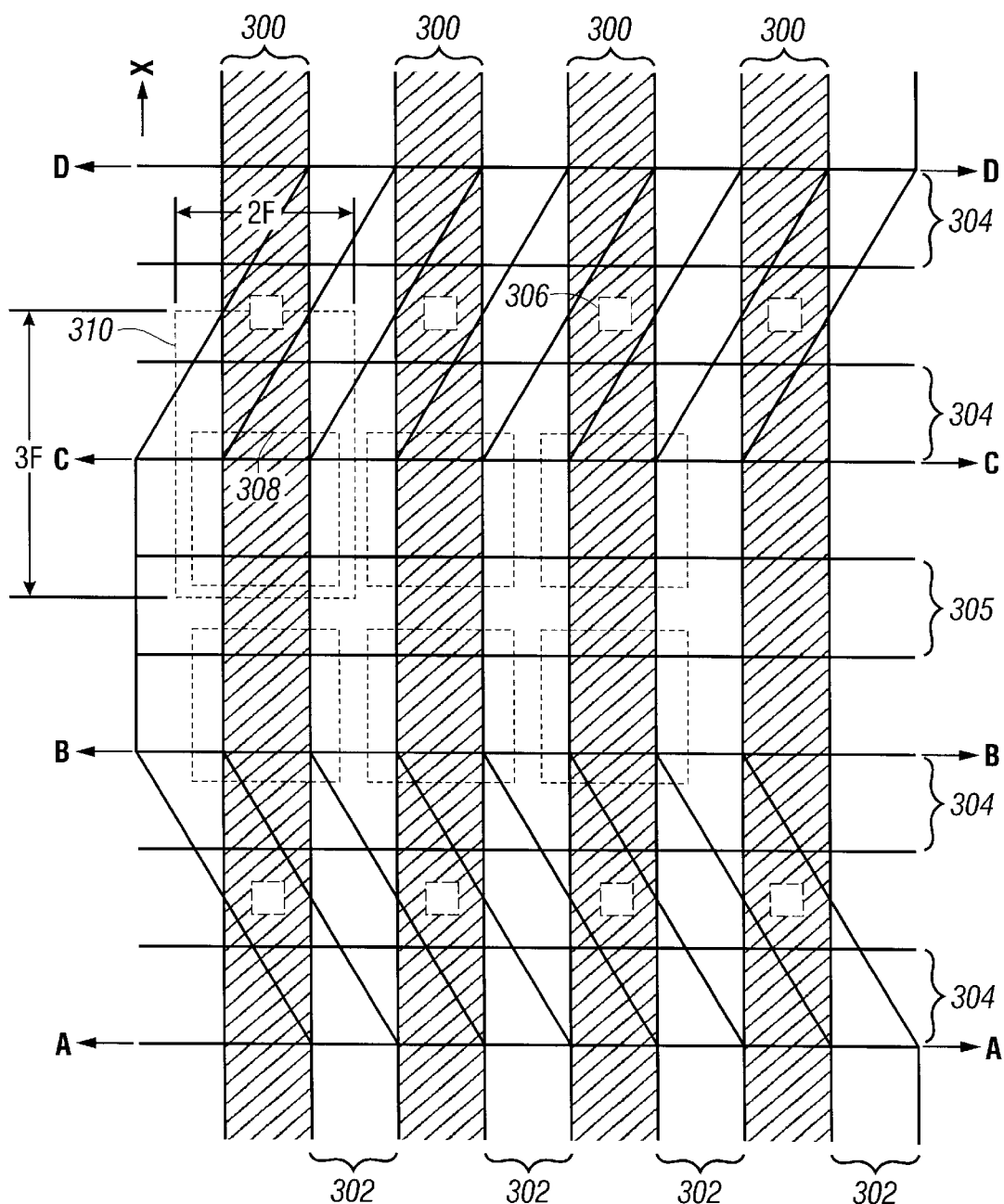
FIG. 22 is an enlarged top view of a semiconductor wafer fragment in accordance with another embodiment of the invention.

Referring to FIG. 22, an alternative memory cell configuration is illustrated. In this configuration, the bit lines 300 are generally straight while the active area lines 302 weave relative to the bit lines. In this embodiment, the continuous active areas 302 run generally in the X direction and have repeated downward jogs. Creating weaving continuous active areas can be simpler than creating weaving bit lines. Active areas are defined by isolation regions relative to a substrate, which initially is on a flat surface of a wafer. Because of the flatness, the bends in the active areas do not create as many photolithographic difficulties as with bit lines, which generally run over relatively rough terrain since the bit lines make contact to the active area surface in some portions and are isolated from active areas in other portions (where the cell capacitors are formed).

At position A—A, the active area lines 302 bend at an angle of about 45°, then bend back at position B—B to run in the X direction. At position C—C, the active area lines bend in the opposite direction from the A—A bend, and bend back to run in the X direction again at position D—D. This pattern is repeated throughout the array.

Bit line contacts 306 are defined at the intersection regions of the bit lines 300 and active areas 302, and memory cell capacitors 310 are formed over portions of the active area 302 for connection to the bit lines in response to activation of a word line. Again, the effective memory cell area is $6F^2$, as indicated by the dashed outline 310.

Figure 23:
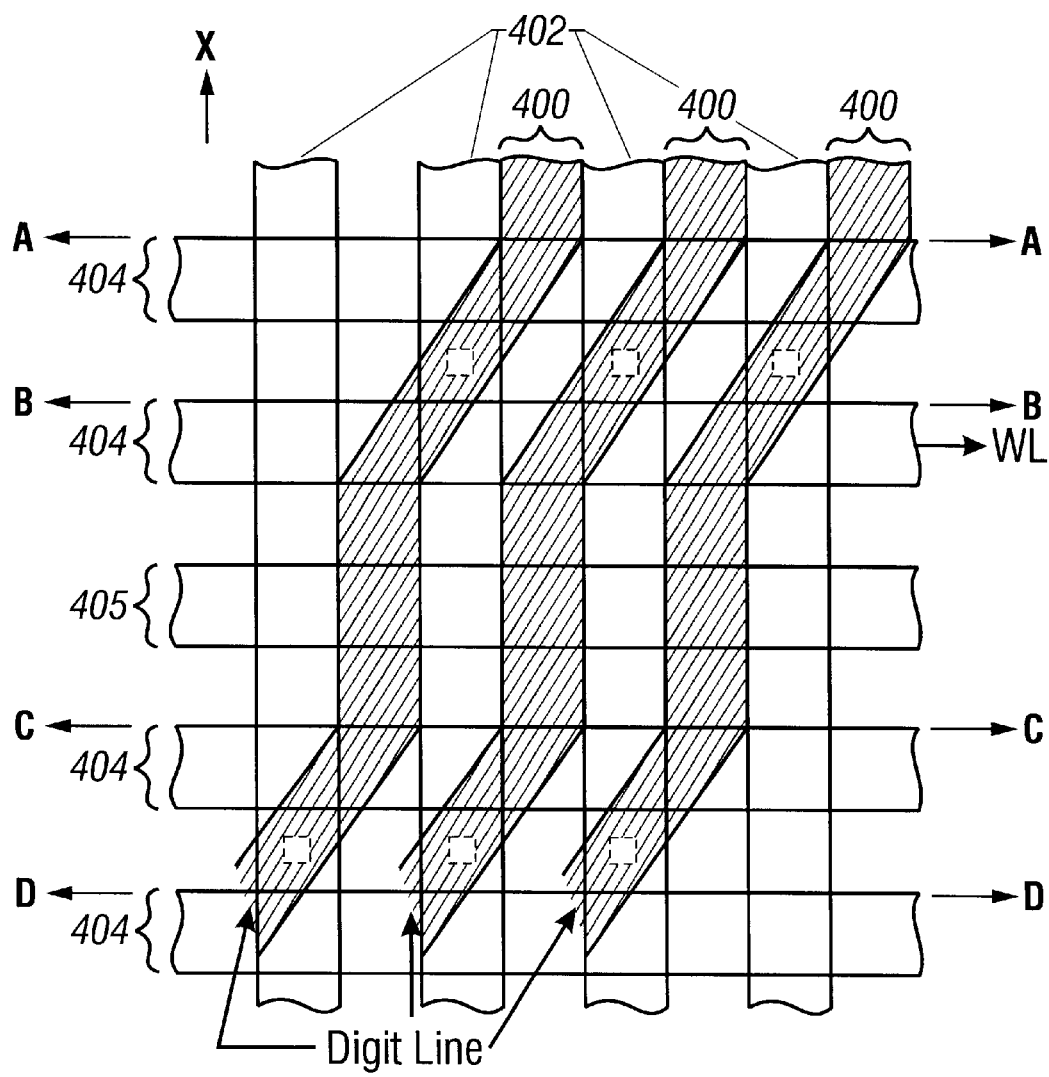
FIG. 23 is an enlarged top view of a semiconductor wafer fragment in accordance with another embodiment of the invention.
Figure 24:
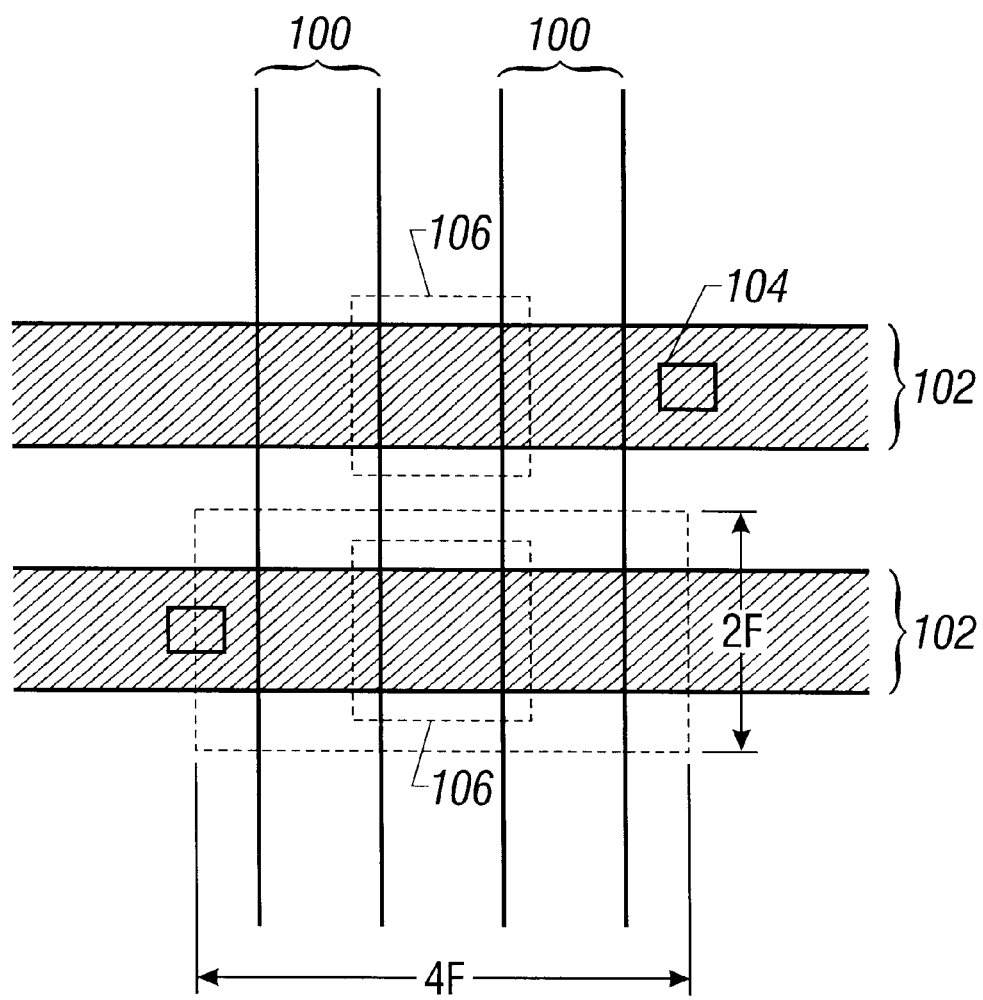
FIG. 24 is an enlarged top view of a conventional semiconductor wafer fragment.

Referring to FIG. 23, a staggered, weaving bit line configuration is illustrated. In this configuration, continuous active area lines 402 are straight while bit lines 400 (which run generally in the X direction) are bent at predefined positions. The bit lines 400 are staggered because they continue to bend in the same direction and do not bend back as in the configuration of FIG. 22. At position A—A, the bit lines 400 bend in a first direction by about 45°, then bend back at position B—B to run in the X direction. At position C—C, the bit lines 400 bend again in the first direction, and bend back at position D—D. This is repeated throughout the array. Because the bit lines are so staggered, the entire array needs to be staggered to accommodate the generally diagonal direction of a column in the array. As a result, the array ends up being generally trapezoidally shaped.

Running generally perpendicularly to the active area lines 402 are conductive lines 404, 405. The conductive lines 404 are word lines, while the conductive line 405 is grounded or negatively biased to provide isolation.

Thus, in the embodiments described, either the bit lines or active area lines, or both, may be weaved by bending the lines at predetermined locations. As examples, the bends in the bit lines and active area lines may range between about 15° and 60°, although larger or smaller angles may be possible with other embodiments.

Embodiments of the invention may have one or more of the following advantages. The memory array size can be reduced while not significantly increasing the complexity of the fabrication process. Ease of contact from the bit lines to a node in the memory cell is maintained even though memory cell size is reduced. The cell provides a larger area for the capacitor container, thereby reducing the stack height and the vertical height of the bit line contact. No contacts are necessary in the memory array, thereby making contact-to-cell plate alignment easier.

Turning now to FIGS. 3–12, a view is taken along line 12—12 in FIG. 2A at a processing point which is prior to the FIG. 2A construction. Although process steps according to one embodiment are illustrated in FIGS. 3–20, it is to be understood that the invention is not to be restricted to such a process of manufacturing embodiments of the invention. The manufacturing process may be modified and structures may be different in further embodiments.

Figure 3:
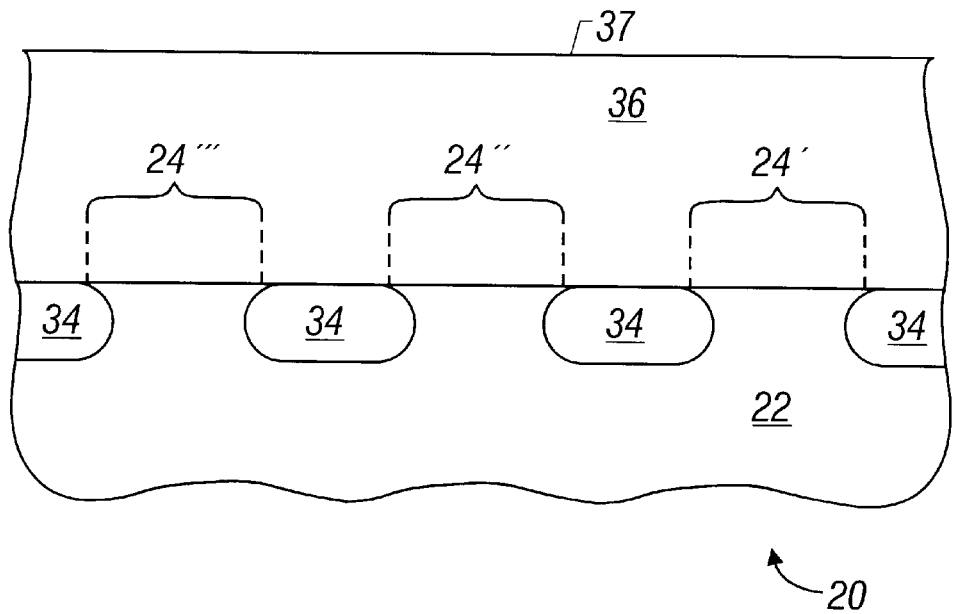
FIG. 3 is a cross sectional view of the FIG. 2A wafer fragment at one processing step taken along line 12—12 in FIG. 2A.

Referring to FIG. 3 a plurality of isolation oxide regions 34 are disposed relative to substrate 22. Regions 34 define, therebetween, continuous active areas 24. Individual continuous active areas 24', 24", and 24''' are indicated in their corresponding positions relative to the FIG. 2A construction. A first insulative layer of material 36 is formed over substrate 22 and the array of continuous active areas 24. The first insulative layer is also formed over conductive lines 26, 28 (FIG. 2A). Insulative layer 36 has an upper surface 37. An exemplary material for layer 36 is borophosphosilicate glass.

Figure 4:
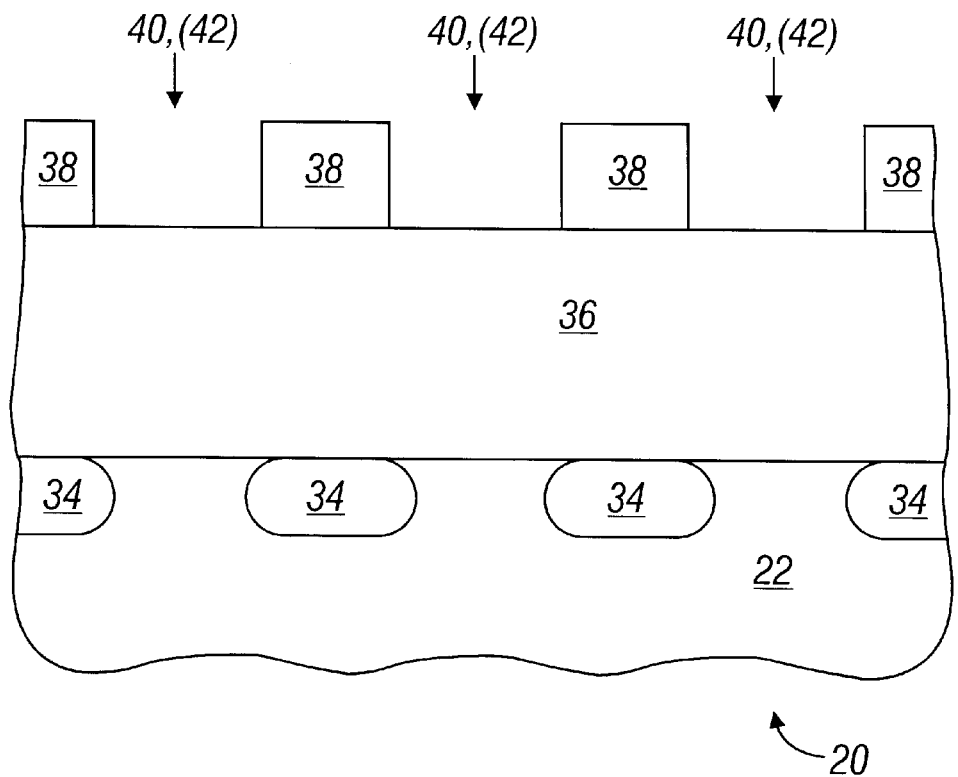
FIG. 4 corresponds to FIG. 3 but shows the wafer fragment at another processing step.

Referring to FIG. 4, a masking material layer or masking substrate such as photoresist is formed over substrate 22 and patterned to form blocks 38. The patterning of the masking material layer provides a single mask which defines a plurality of patterned openings which are designated at 40(42). The significance of the parenthetical designation is to indicate that openings 40(42) are formed and collectively arranged to define a pattern of both bit line contact openings 40 and capacitor contact openings 42. Accordingly, both capacitor contact openings and bit line contact openings are patterned over insulative layer 36 in a common masking step.

Figure 5:
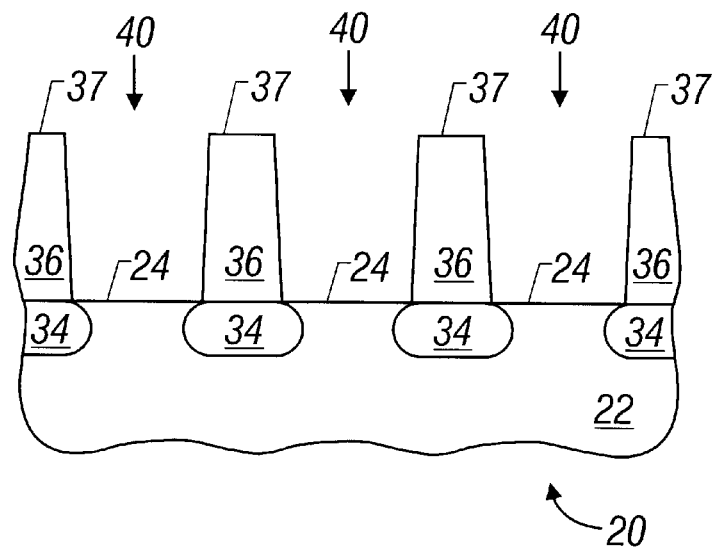
FIG. 5 corresponds to FIG. 3 but shows the wafer fragment at another processing step.

Referring to FIG. 5, openings are etched or otherwise formed in or through first insulative layer 36 to expose active area portions corresponding to the illustrated active areas 24. The exposing of the active area portions defines both capacitor contact openings 42 and bit line contact openings 40 for memory cells 30 (FIG. 2A) which are to be formed. In accordance with an embodiment, both the capacitor contact openings and the bit line contact openings are etched at the same time. Such openings, however, can be etched at different times. The pattern which defines the layer 36 material to be etched or removed may be a stripe that follows the corresponding continuous active areas 24. Blocks 38 are then stripped or otherwise removed. In one aspect, the stripping or removal of blocks 38 constitutes removing photoresist proximate the patterned bit line contact openings and capacitor contact openings in at least one common step.

In an alternative embodiment, instead of a stripe pattern to form bit contacts 100 and capacitor cell contacts, a process may form individual contact holes to form bit contacts 101 and capacitor cell contacts. As illustrated in FIG. 2B, the holes formed for bit contacts 101 may be made to be slightly oversized to account for potential misalignment. As a result, some overlap of the contact holes and the conductive lines 26 and 28 (word lines and isolation lines) may occur. The capacitor cell contacts may also be made slightly oversized to ensure alignment.

Figure 6:
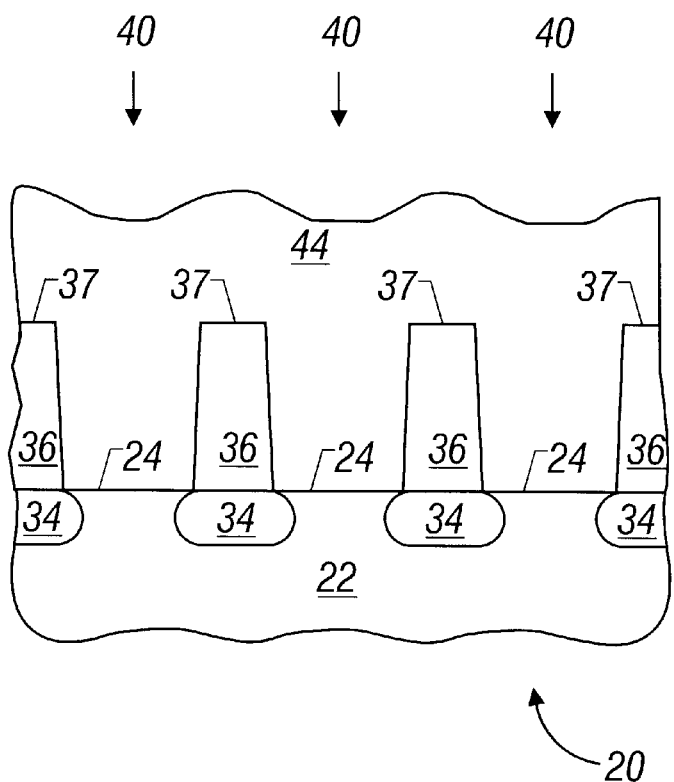
FIG. 6 corresponds to FIG. 3 but shows the wafer fragment at another processing step.

Referring to FIG. 6, a layer 44 of conductive material is formed over substrate 22 and the memory array. The layer 44 may be formed within both the capacitor contact openings and the illustrated bit line contact openings 40 of FIG. 5. Such material may be in electrical communication with the associated active area portions over which it is formed. An exemplary material for layer 44 comprises conductively doped polysilicon.

Figure 7:
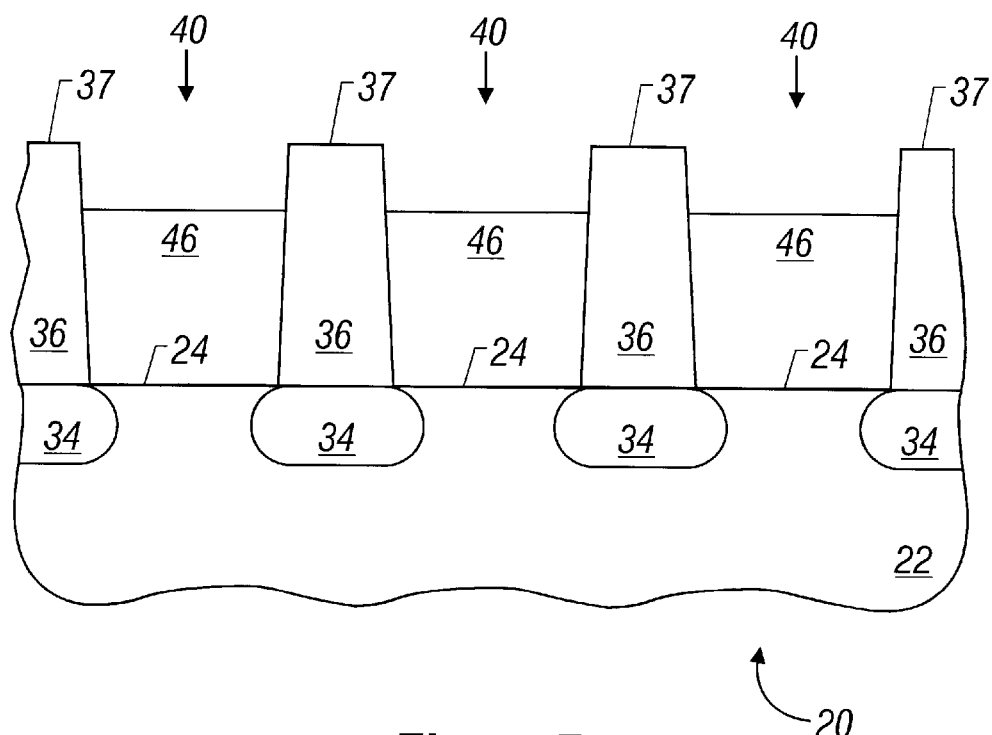
FIG. 7 corresponds to FIG. 3 but shows the wafer fragment at another processing step.
Figure 13:
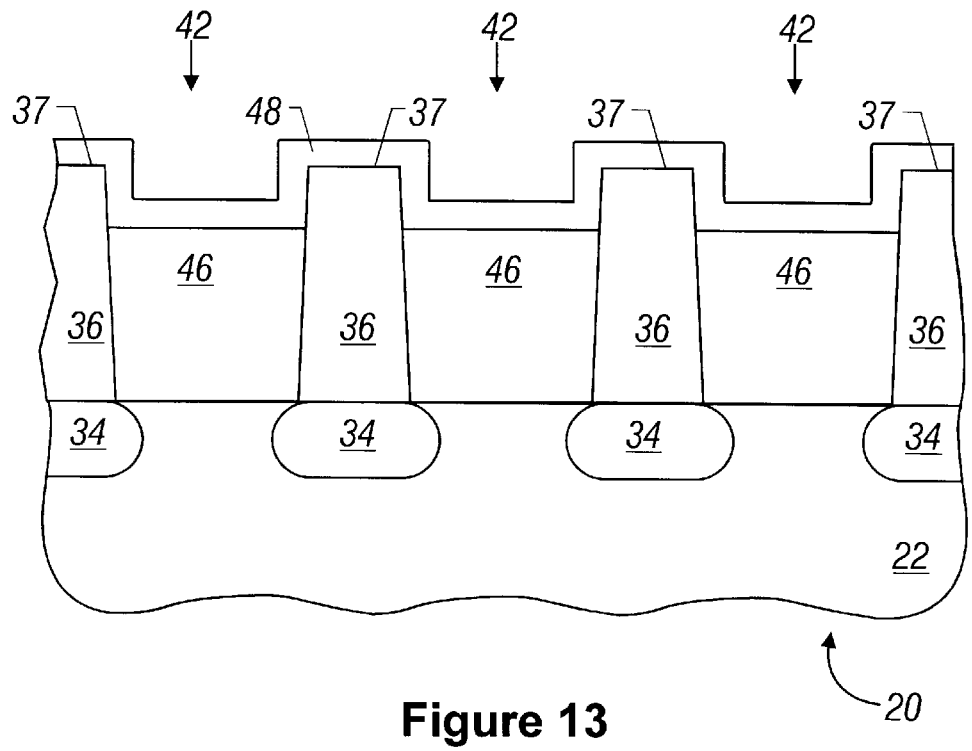
FIG. 13 is a cross-sectional view taken along line 19—19 in FIG. 3 after a processing step which corresponds to the processing step shown in FIG. 8.

Referring to FIG. 7, portions of the layer 44 are removed to a degree sufficient to electrically isolate conductive material plugs 46 within the openings defined by first insulative layer 36. The removal of layer 44 material can be accomplished by any suitable method which is effective to isolate the illustrated plugs 46. Such can include a resist etch back, a timed etch, or planarization relative to upper surface 37 of insulative layer 36. In accordance with an embodiment of the invention, layer 44 material is selectively removed relative to the insulative layer and to a degree sufficient to recess the conductive material below the insulative layer upper surface 37. Such removal effectively forms isolated conductive material plugs 46 within the individual associated openings. Recessed conductive plugs 46 are shown in FIG. 13 and correspond to conductive plugs which are formed relative to and within capacitor contact openings 42. All of such plugs of conductive material may be in electrical communication with their associated substrate portions 24.

Figure 8:
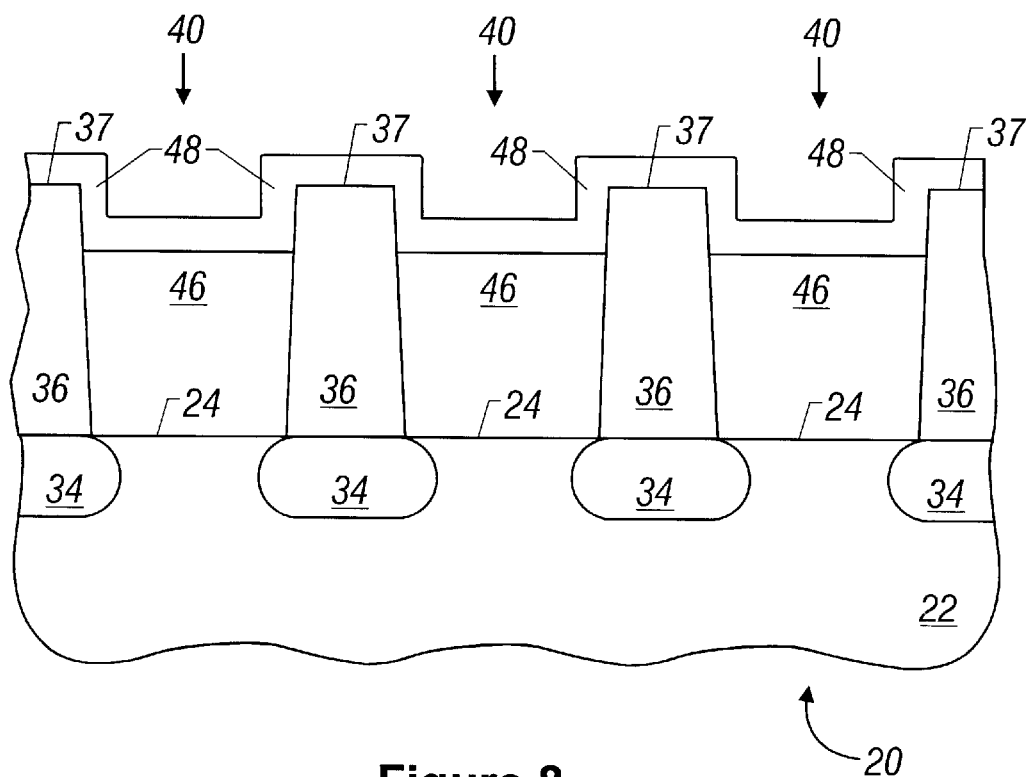
FIG. 8 corresponds to FIG. 3 but shows the wafer fragment at another processing step.

Referring to FIGS. 8 and 13, a layer 48 of second insulative material is formed over the array and over all of the previously formed conductive plugs. Accordingly, layer 48 material is formed over and relative to bit line contact openings 40 and capacitor contact openings 42 (FIG. 13). An exemplary material for layer 48 is $SiO_2$. Other insulative materials can be used, such as silicon nitride.

Figure 9:
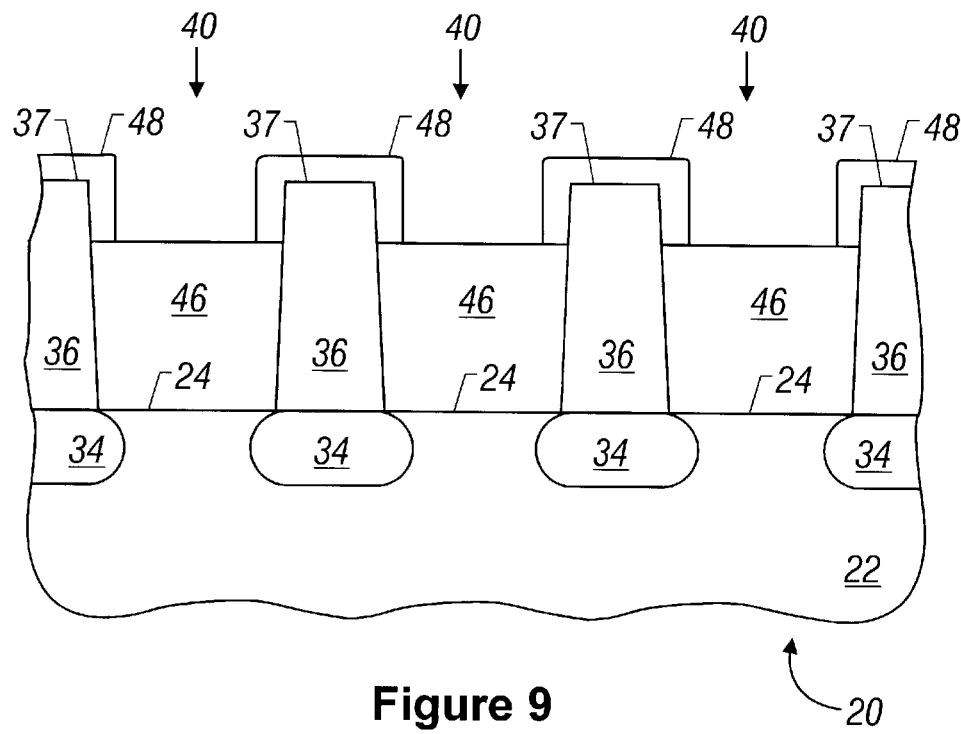
FIG. 9 corresponds to FIG. 3 but shows the wafer fragment at another processing step.

Referring to FIGS. 9 and 13, material of second insulative layer 48 is removed from only over bit line contact openings 40 (FIG. 9) to expose the associated plugs 46. Such can be accomplished by a suitable masked etch of the second insulative layer material from over bit line contact openings 40. Accordingly, as shown in FIG. 13, material of insulative layer 48 remains over the plugs 46 which are disposed within the capacitor contact openings 42. This effectively electrically insulates the associated capacitor contact opening plugs during formation of buried bit or digit lines described below.

Figure 10:
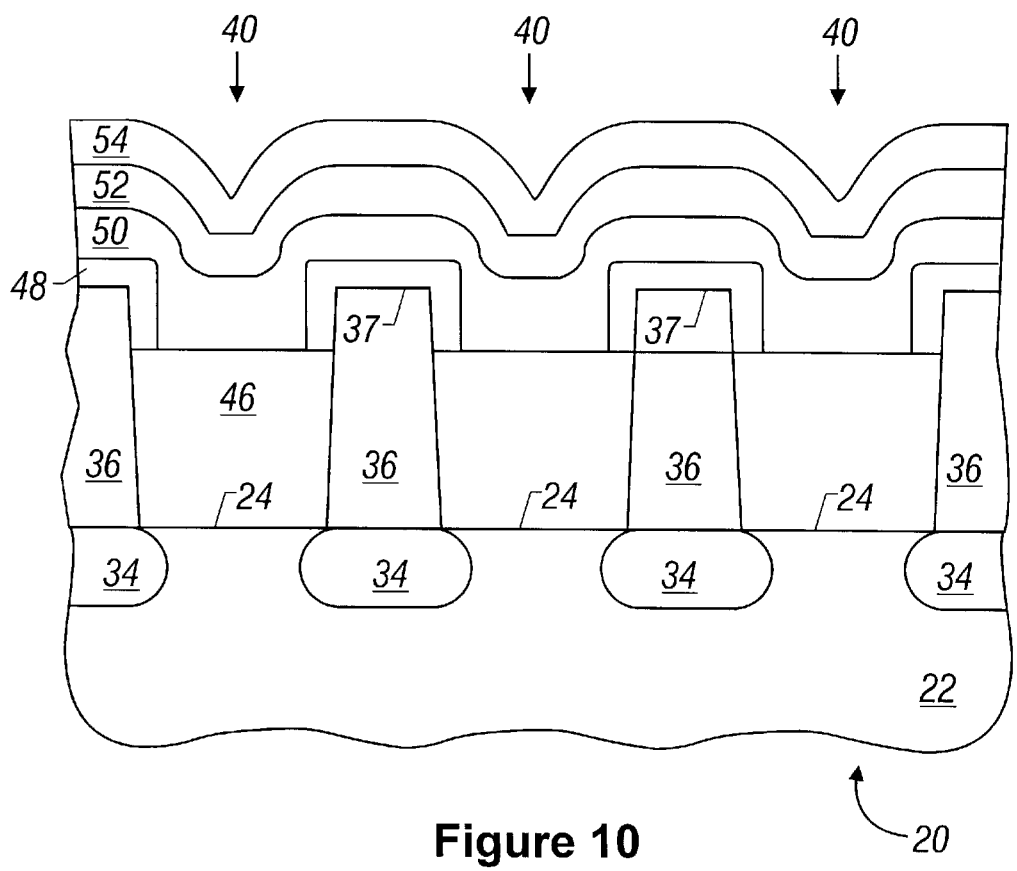
FIG. 10 corresponds to FIG. 3 but shows the wafer fragment at another processing step.
Figure 14:
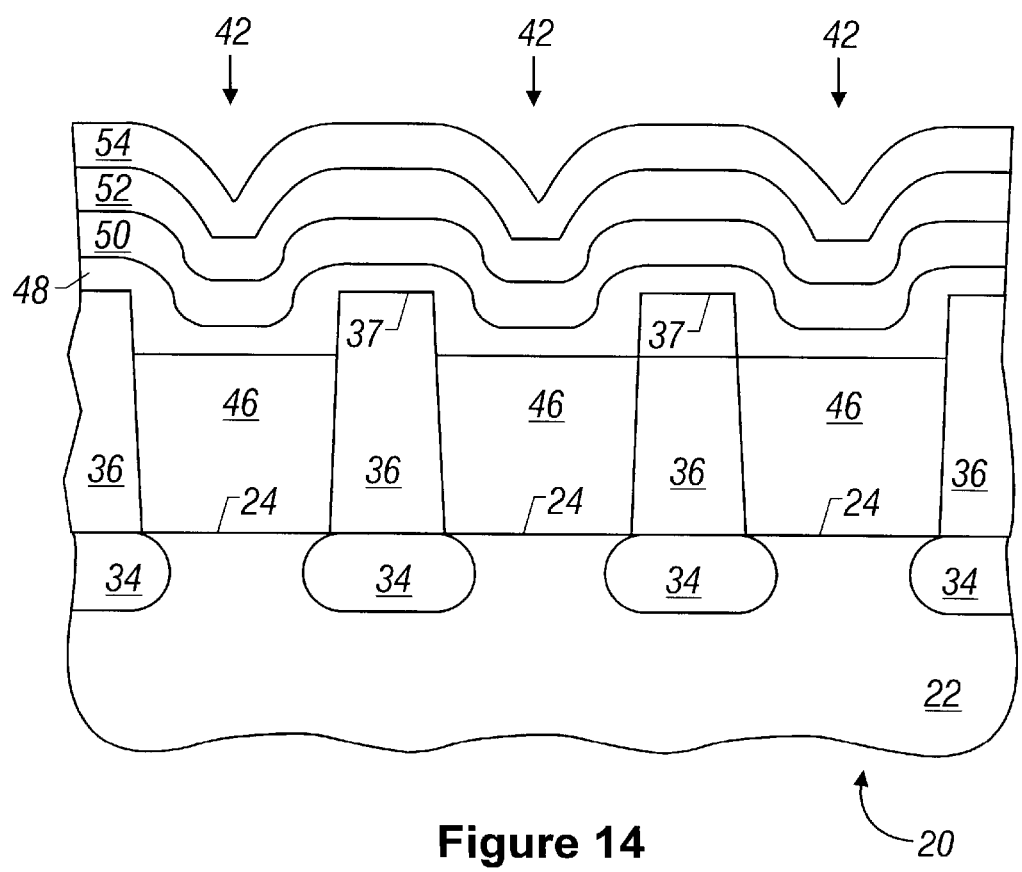
FIG. 14 corresponds to FIG. 3 but shows the wafer fragment at a processing step which corresponds to the processing step shown in FIG. 10.

Referring to FIGS. 10 and 14, various layers of material from which buried bit lines are to be formed are formed over the substrate. In one implementation, a layer 50 of conductive material is formed over substrate 22. As shown in FIG. 10, layer 50 is in electrical communication with plugs 46. However, as shown in FIG. 14, layer 50 is electrically insulated from plugs 46 by second insulative material layer 48. An exemplary material for layer 50 is conductively doped polysilicon. A more conductive layer 52 (containing silicide, for example) can be provided over layer 50. An exemplary material for layer 52 is $WSi_x$ or W. A layer 54 of insulative material can be formed over layer 52. An exemplary material for layer 54 is an oxide material. The above constitutes but one way of forming the layers which comprise the bit lines. Other materials and layers are possible.

Figure 11:
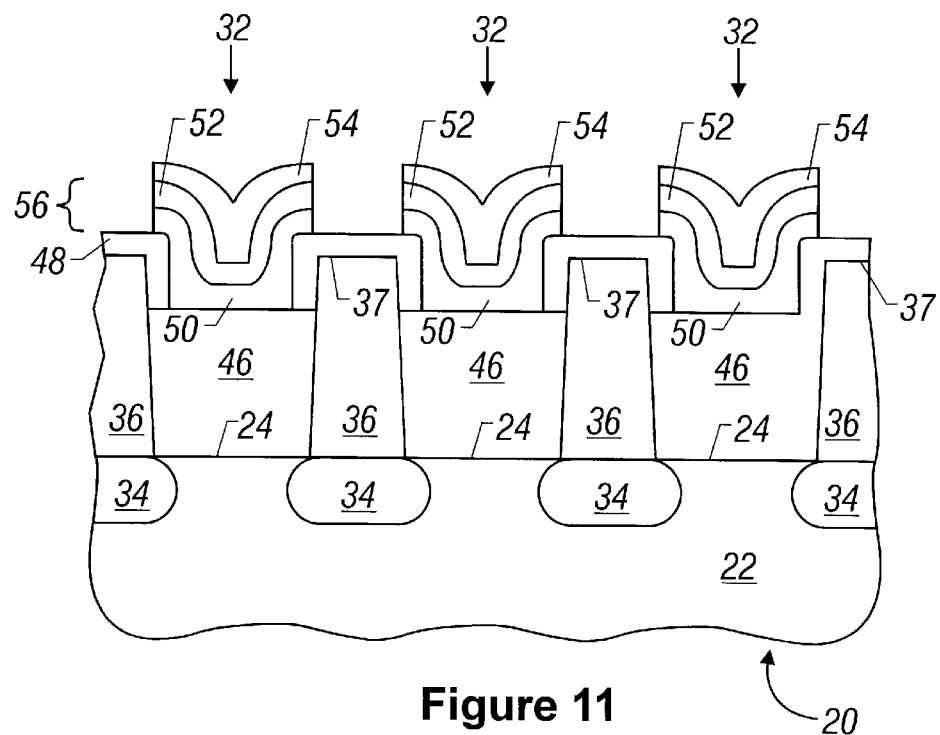
FIG. 11 corresponds to FIG. 3 but shows the wafer fragment at another processing step.
Figure 15:
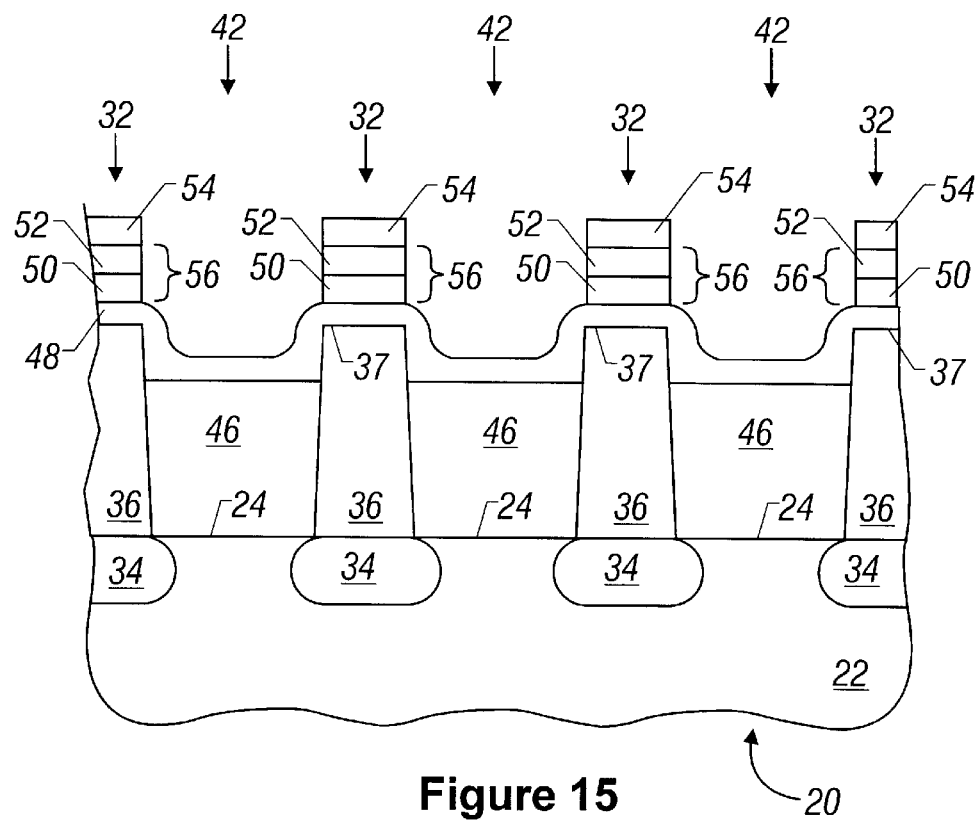
FIG. 15 corresponds to FIG. 3 but shows the wafer fragment at another processing step.

Referring to FIGS. 11 and 15, such layers are subsequently patterned and etched to define a plurality of bit lines 32 having conductive bit line portions 56 which, as shown in FIG. 11, are in electrical communication with respective plugs 46. However, as shown in FIG. 15, bit lines 32 are disposed over first insulative layer 36 and electrically insulated from the corresponding conductive plugs 46 by layer 48. This constitutes one way of forming a plurality of conductive bit lines over the array with individual bit lines being operably associated with individual continuous active areas and in electrical communication with individual respective plugs of conductive material within the bit line contact openings 40 (FIG. 11).

Figure 16:
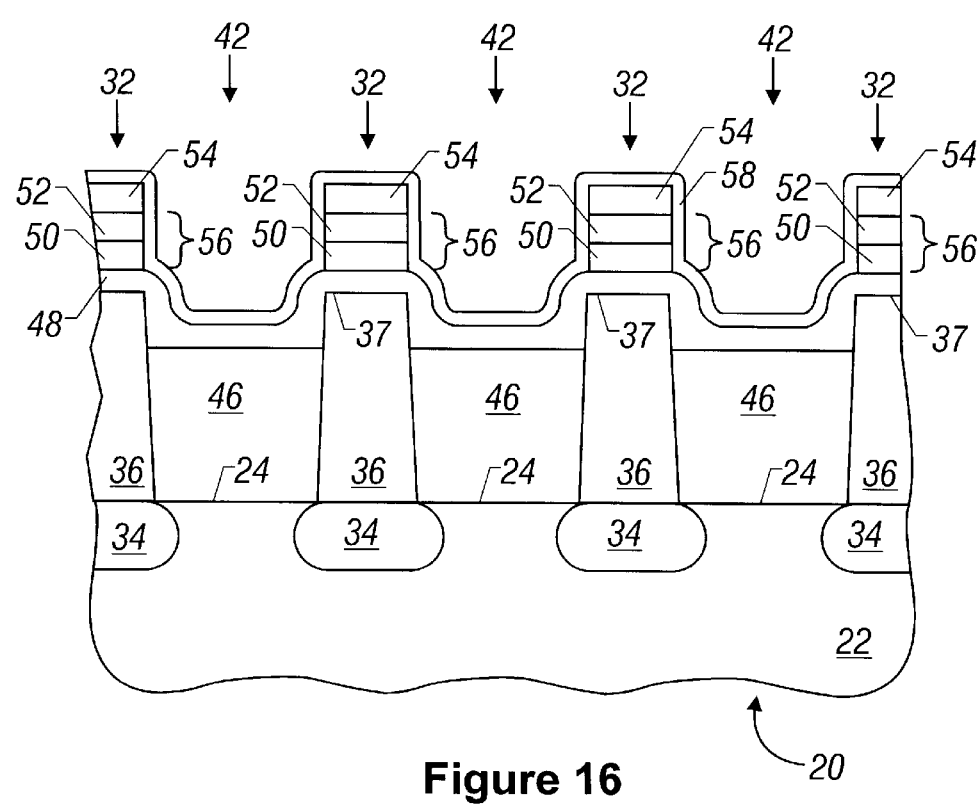
FIG. 16 corresponds to FIG. 3 but shows the wafer fragment at another processing step.

Referring to FIGS. 12 and 16, a layer 58 of insulative spacer material is formed over the substrate as shown. Such material can comprise either a suitable oxide or nitride material. In one implementation, layer 58 comprises an oxide formed through suitable decomposition of tetraethyloxysilicate (TEOS). Such effectively electrically insulates exposed conductive portions 56 of the conductive bit lines.

Figure 17:
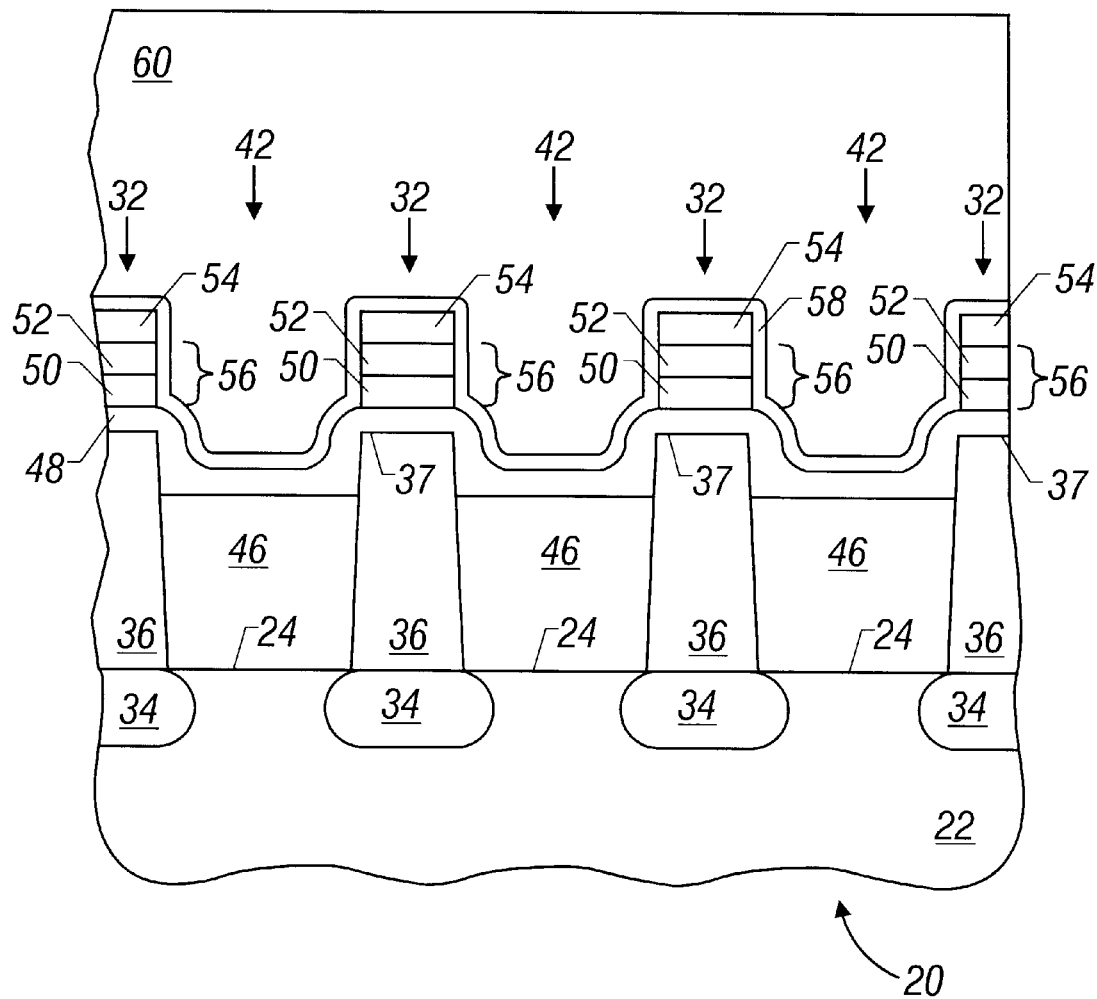
FIG. 17 corresponds to FIG. 3 but shows the wafer fragment at another processing step.

Referring to FIG. 17, a third insulative layer 60 is formed over the array. An exemplary material for layer 60 is borophosphosilicate glass (BPSG).

Figure 18:
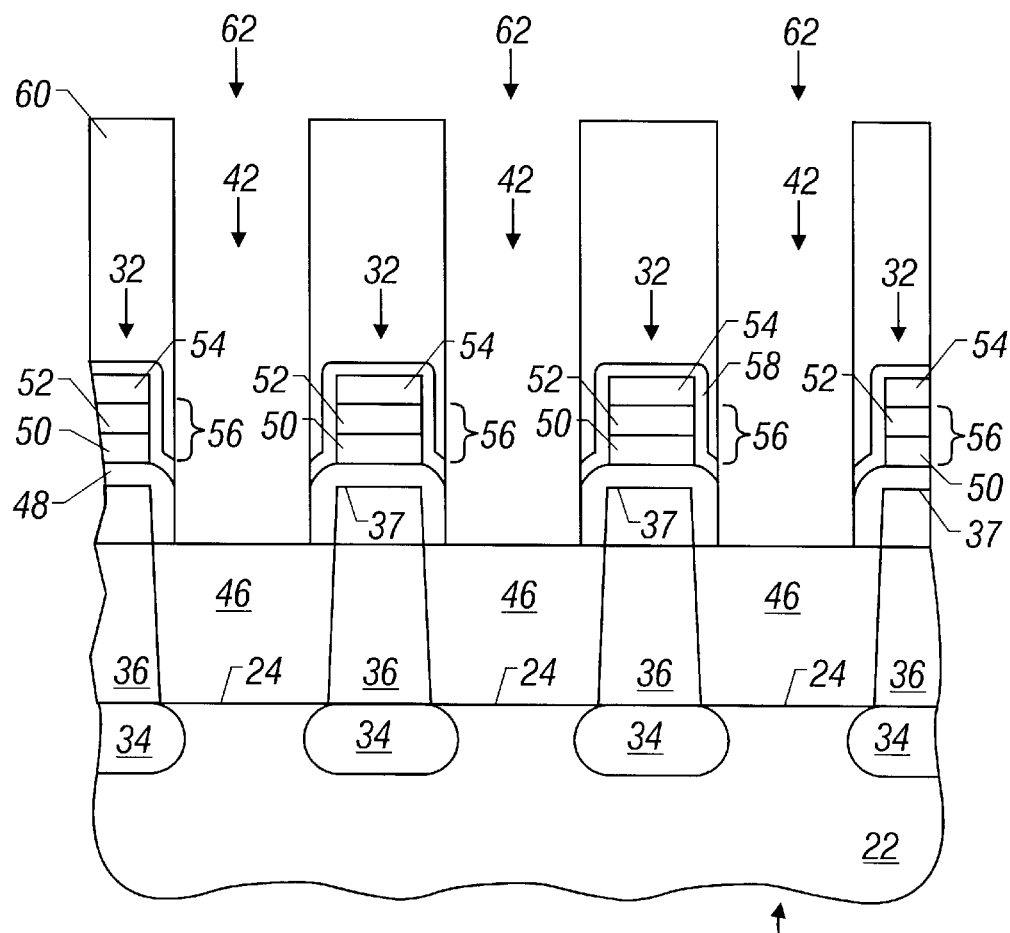
FIG. 18 corresponds to FIG. 3 but shows the wafer fragment at another processing step.

Referring to FIG. 18, layer 60 material is patterned and etched over and relative to conductive plugs 46 and capacitor contact openings 42 to expose the associated conductive plugs. Accordingly, such forms capacitor openings 62 within which capacitors are to be formed.

Referring to FIG. 19A, individual first capacitor plate structures 64 are formed relative to and within associated capacitor openings 62. Such plate structures are in electrical communication with individual respective plugs 46. A layer 66 of dielectric material and second capacitor plate structure 68 are formed relative to and operably associated with individual first capacitor plate structures 64 to provide individual memory cells which, in accordance with one embodiment, form DRAM storage capacitors. The insulating layer 39 may be formed in the opening 42 (defined by the wall of the second capacitor plate 68) as well as above the capacitor. In an alternative embodiment, as shown in FIG. 19B, a plug 43 (formed of polysilicon or other conductive material, for example) may be formed in the opening 42 to fill up the opening at about the same level as the layer 54. Alternatively, the plug 43 may be formed below the level of the layer 54 (to provide a recessed plug) or above the level of the layer 54 (to provide individual plugs). The plug 43 is defined between isolation spacers 73 surrounding the bit lines 32. An advantage of such an embodiment is that a deep self-aligned contact (SAC) etch to open up the hole 42 can be avoided in order to contact the layer 46.

In an alternative embodiment, instead of using a memory cell capacitor in a container as shown in FIGS. 19A and 19B, a stud, a protruding solid plug, or other structure protruding generally upwardly can be formed so that the outer surface of the protruding structure is used to provide the surface area of the capacitor. This enhances the cell capacitance as dimensions continue to shrink, which may limit the surface area available with container-shaped capacitors.

Figure 20:
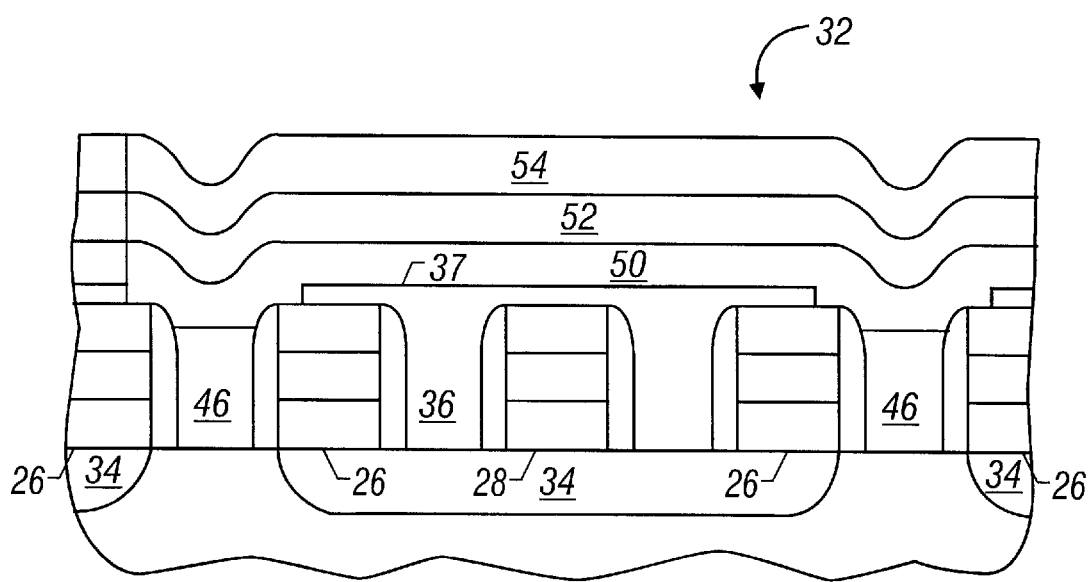
FIG. 20 is a slightly enlarged cross-sectional view taken along line 20—20 in FIG. 2A.

Referring to FIG. 20, an enlarged view of the array taken generally along line 20—20 (FIG. 2A) is shown. The section is taken along a buried bit line 32. Accordingly, as shown, bit line 32 may be seen to overlie conductive lines 26, 28 and associated isolation oxide regions 34. Bit line 32 can also be seen to be in electrical communication with the two illustrated plugs 46 that act as bit line contacts.

The above described methodology may have advantages over prior processing methods. One such advantage is that both the bit line contact openings and the capacitor contact openings are patterned in a common masking step. Hence, bit line contacts and capacitor contacts can be formed at the same time. Accordingly, processing steps are reduced. Additionally, extra processing steps which were formerly necessary to remove undesired conductive material left behind after bit line formation may be reduced, if not eliminated. Furthermore, bit line-to-word line capacitance may be reduced.

While the invention has been disclosed with respect to a limited number of embodiments, those skilled in the art will appreciate numerous modifications and variations therefrom. It is intended that the appended claims cover all such modifications and variations as fall within the true spirit and scope of the invention.

What is claimed is:

1. A semiconductor device comprising:
   generally linearly extending bit lines; and
   continuous active area lines, wherein each active area line has a first portion on a first side of a corresponding bit line, a second portion on a second side of the corresponding bit line, and a third portion on the first side of the corresponding bit line.

2. The semiconductor device of claim 1, further comprising a memory array having the bit lines and continuous active area lines, wherein the continuous active area lines extend continuously along the memory array.

3. The semiconductor device of claim 2, wherein the memory array has a first edge and a second edge, the continuous active area lines extending substantially from the first edge to the second edge.

4. The semiconductor device of claim 1, further comprising a memory array having the bit lines and continuous active area lines, the continuous active area lines extending continuously from one edge of the memory array to another edge of the memory array.

5. A memory device comprising:
   continuous active area lines; and
   bit lines, each bit line having a first portion on a first side of a corresponding active area line, a second portion on a second side of the corresponding active area line, and a third portion on the first side of the active area line.

6. The memory device of claim 5, further comprising memory cells in electrical contact with portions of the active area lines, each memory cell having generally an area of about $6F^2$.

7. The memory device of claim 5, further comprising a memory array having the continuous active area lines and bit lines, the continuous active area lines extending continuously from one edge of the memory array to another edge of the memory array.

8. A semiconductor device, comprising:
   memory cells;
   bit lines;
   continuous active area lines running generally along a first direction and being generally in parallel to the bit lines, transistors formed in active area lines and electrically coupling corresponding memory cells to corresponding bit lines,
   wherein each active area line bends at predefined locations to form portions slanted relative to the bit lines, each slanted portion of the active area lines intersecting at an angle a corresponding portion of one of the bit lines; and
   bit contacts each formed in a region generally defined by an angled intersection of a bit line and a corresponding active area line.

9. The semiconductor device of claim 8, wherein each memory cell has an area of about $6F^2$.

10. The semiconductor device of claim 8, further comprising a support structure, wherein each active area line is formed in channels defined in the support structure.

11. The semiconductor device of claim 8, wherein each active area line bends at an angle between about 15° and 60°.

12. The semiconductor device of claim 8, wherein the bit lines are substantially straight.

13. The semiconductor device of claim 8, further comprising bit lines formed over the active area lines, the bit lines also bending at predefined positions.

14. The semiconductor device of claim 8, wherein the memory cells include capacitors formed over the bit lines.

15. The semiconductor device of claim 8, further comprising a memory array having the memory cells, bit lines, continuous active area lines, and bit contacts, wherein the continuous active area lines extend continuously from one edge of the memory array to another edge of the memory array.

16. A memory device, comprising:
   memory cells each having an area of about $6F^2$;
   sense amplifiers;
   active area lines extending along a direction and electrically connected to the memory cells; and
   bit lines coupled to the sense amplifiers in a folded bit line arrangement, the bit lines extending along generally the same direction as the active area lines and weaving with respect to the active area lines so that the bit lines and active area lines intersect at predetermined locations.

17. The memory device of claim 16, further comprising access lines extending generally perpendicularly to the active area lines and bit lines, wherein at least one of the active area lines and bit lines include slanted portions at the predetermined locations of intersection.

18. The memory device of claim 17, wherein each access line is shaped generally as a parallelogram in a given area of the memory device.

19. The memory device of claim 16, wherein each memory cell includes a memory capacitor having a protruding solid plug to enhance cell capacitance.

20. A memory device, comprising:
   memory cells;
   active area lines extending along a direction and electrically connected to the memory cells; and
   bit lines extending along generally the same direction as the active area lines and weaving with respect to the active area lines so that the bit lines and active area lines intersect at predetermined locations,
   wherein the memory cells include memory capacitors and contact plugs electrically connecting the memory capacitors to the active area lines, the memory device further comprising isolation lines biased at approximately a ground voltage or a negative voltage to electrically isolate adjacent contact plugs.

21. A memory device comprising:
   continuous active area lines extending generally along a first direction;

bit lines extending generally along the first direction, the active area lines and bit lines extending generally in parallel and intersecting at slanted portions;

contacts between the bit lines and continuous active area lines formed in the slanted portions; and a memory array having a plurality of rows and columns of memory cells, the continuously active area lines, bit lines, and contacts, the continuous active area lines extending continuously from one edge of the memory array to another edge of the memory array.

22. The memory device of claim 21, wherein the active area lines are generally straight and the bit lines extend in a wavy pattern.

23. The memory device of claim 21, wherein the bit lines are generally straight and the active area lines extend in a wavy pattern.

24. The memory device of claim 21, wherein the bit lines and the active area lines both extend in wavy patterns.

25. A memory device comprising:

continuous active area lines extending generally in a first direction;

bit lines extending generally in the first direction and laterally spaced apart from the continuous active area lines except at portions where the active area lines and bit lines intersect; and a memory array having a plurality of rows and columns of memory cells, the continuous active area lines and bit lines, the continuous active area lines extending continuously from the edge or the memory array to another edge of the memory array.

26. The memory device of claim 25, wherein the memory cells are in electrical contact with portions of the active area lines, each memory cell having generally an area of about $6F^2$.

27. The memory device of claim 26, further comprising contacts formed in the intersecting portions of the bit lines and active area lines to electrically couple the bit lines and the active area lines.

28. The memory device of claim 25, further comprising a memory array having the memory cells, bit lines, continuous active area lines, and contacts, wherein the continuous active area lines extend continuously from one edge of the memory array to another edge of the memory array.

29. The memory device of claim 28, wherein each bit line is jogged repeatedly along a first direction.

30. The memory device of claim 29, wherein each active area line is jogged repeatedly along a second direction opposite the first direction.

31. The memory device of claim 29, wherein the jogging in each bit line is formed by bending the bit line at predetermined positions.

32. The memory device of claim 29, wherein the bending in each bit line forms protruding sections from the bit line.

33. The memory device of claim 29, further comprising a memory array containing the memory cells, bit lines, active area lines, transistors, and contacts, wherein the bending in each bit line causes the bit line to stagger diagonally along the memory array.

34. The memory device of claim 29, wherein each bit line has a bend that has an angle between about 15° and 60°.

35. The memory device of claim 29, wherein each bit line has a bend that has an angle of about 45°.

36. The memory device of claim 28, wherein each memory cell has an area of $6F^2$.

* * * * *

UNITED STATES PATENT AND TRADEMARK OFFICE
CERTIFICATE OF CORRECTION

PATENT NO. : 6,410,948 B1
DATED : June 25, 2002
INVENTOR(S) : Luan Tran, D. Mark Durcan, Tyler A. Lowrey, Rob B. Kerr and Kris K. Brown It is certified that error appears in the above-identified patent and that said Letters Patent is hereby corrected as shown below:

<u>Column 14,</u>
Lines 5-9, "The memory device of claim 25 further comprising a memory array having the memory cells, bit lines, continuous active area lines, and contacts, wherein the continuous active area lines extend continuously from one edge of the memory array to another edge of the memory array."

should be:

-- A memory device, comprising:
  memory cells;
  bit lines;
  continuous active area lines running generally in parallel to the bit lines, transistors formed in each active area line and electrically coupling memory cells to corresponding bit lines,
  wherein each bit line includes slanted portions, each slanted portion intersecting a corresponding portion of an active area line at an angle;
  contacts electrically coupling each bit line to portions of a corresponding active area line, each contact formed in a region generally defined by the angled intersection of the bit line to the active area line; and
  a memory array having a plurality of rows and columns of the memory cells, bit lines, continuous active area lines, and contacts, wherein the continuous active area lines extend continuously from one edge of the memory array to another edge of the memory array. --

UNITED STATES PATENT AND TRADEMARK OFFICE
CERTIFICATE OF CORRECTION

PATENT NO.    : 6,410,948 B1
DATED         : June 25, 2002
INVENTOR(S)   : Luan Tran, D. Mark Durcan, Tyler A. Lowrey, Rob B. Kerr and Kris K. Brown It is certified that error appears in the above-identified patent and that said Letters Patent is hereby corrected as shown below:

Column 14 cont'd,
Line 19, "claim 29" should be -- claim 31 --;
Line 21, "claim 29" should be -- claim 31 --;
Line 26, "claim 29" should be -- claim 31 --;
Line 28, "claim 29" should be -- claim 31 --.

Signed and Sealed this

Twelfth Day of November, 2002

Attest:

Attesting Officer

JAMES E. ROGAN
*Director of the United States Patent and Trademark Office*